(12) United States Patent
Nakata

(10) Patent No.: US 8,709,841 B2
(45) Date of Patent: Apr. 29, 2014

(54) WOVEN MESH SUBSTRATE WITH SEMICONDUCTOR ELEMENTS, AND METHOD AND DEVICE FOR MANUFACTURING THE SAME

(75) Inventor: Josuke Nakata, Kyoto (JP)

(73) Assignee: Kyosemi Corporation, Kyoto (JP)

( * ) Notice: Subject to any disclaimer, the term of this patent is extended or adjusted under 35 U.S.C. 154(b) by 0 days.

(21) Appl. No.: 13/816,858

(22) PCT Filed: Feb. 8, 2011

(86) PCT No.: PCT/JP2011/052579
§ 371 (c)(1),
(2), (4) Date: Feb. 13, 2013

(87) PCT Pub. No.: WO2012/026142
PCT Pub. Date: Mar. 1, 2012

(65) Prior Publication Data
US 2013/0145588 A1    Jun. 13, 2013

(30) Foreign Application Priority Data

Aug. 26, 2010 (WO) .................. PCT/JP2010/064459
Oct. 4, 2010 (WO) .................. PCT/JP2010/067376

(51) Int. Cl.
*H01L 21/00* (2006.01)
*H01L 27/14* (2006.01)
*H01L 23/02* (2006.01)

(52) U.S. Cl.
USPC ................ 438/26; 438/64; 257/431; 257/678

(58) Field of Classification Search
None
See application file for complete search history.

(56) References Cited

U.S. PATENT DOCUMENTS

| | | | |
|---|---|---|---|
| 4,691,076 | A | 9/1987 | Levine et al. |
| 5,469,020 | A | 11/1995 | Herrick |
| 7,220,997 | B2 | 5/2007 | Nakata |
| 7,238,966 | B2 | 7/2007 | Nakata |
| 2006/0043390 | A1 | 3/2006 | Nakata |
| 2006/0086384 | A1 | 4/2006 | Nakata |

FOREIGN PATENT DOCUMENTS

| | | |
|---|---|---|
| JP | 60-068507 | 4/1985 |
| JP | 9-016243 | 1/1997 |
| WO | WO-03/094248 | 11/2003 |
| WO | WO-2004/001858 | 12/2003 |

*Primary Examiner* — Scott B Geyer
(74) *Attorney, Agent, or Firm* — Jordan and Hamburg LLP

(57) ABSTRACT

A woven mesh substrate with semiconductor elements and a method and a device for manufacturing such a substrate, and more particularly a technique that makes it possible to exploit a woven mesh substrate with semiconductor elements in which a plurality of spherical semiconductor elements having a light receiving function or a light-emitting function are installed on a woven mesh substrate in net form that is made up from a plurality of vertical strands that are insulating and a plurality of horizontal strands that are conductive.

23 Claims, 17 Drawing Sheets

WOVEN MESH SUBSTRATE WITH SEMICONDUCTOR ELEMENTS, AND METHOD AND DEVICE FOR MANUFACTURING THE SAME

BACKGROUND OF THE INVENTION

The present invention relates to a woven mesh substrate with semiconductor elements and to a method and a device for manufacturing such a substrate, and more particularly relates to a technique that makes it possible to exploit a woven mesh substrate with semiconductor elements in which a plurality of spherical semiconductor elements having a light-receiving function or a light-emitting function are installed on a woven mesh substrate in net form that is made up from a plurality of vertical strands that are insulating and a plurality of horizontal strands that are conductive.

From the past, development has been underway of light reception devices such as solar batteries and so on, and of light emission devices such as EL displays and so on, having a construction in which a thin layer of semiconductor is formed over a flexible sheet that is insulating or conductive. While such semiconductor devices, over the whole range from small to comparatively large, can be manufactured by individually and sequentially forming thin semiconductor layers and electrodes and wiring and so on, they are all planar type semiconductor devices, and are formed upon standard sheets.

On the other hand, light-receiving and light-emitting devices using spherical semiconductor elements have been proposed. For example, in Patent Document #1, there is disclosed a flexible solar cell having a construction in which spherical semiconductor elements (i.e. spherical solar cells), in each of which a p n junction shaped as a spherical surface is formed on a spherical p type silicon crystal, are adhered to two aluminum sheets that are adhered together via an insulation layer, and the p type layers and the n type layers of the semiconductor elements are respectively connected to these aluminum sheets.

And in Patent Document #2 there are disclosed a light-emitting display and a method for manufacturing it, in which a large number of spherical light-emitting elements (i.e. light-emitting diodes) are arranged along X and Y directions as a matrix on the surface of a flexible plastic film, and electrodes of these spherical light-emitting elements are electrically connected to electrodes that are shaped as sheets.

The devices of Patent Documents #1 and #2 have structures in which solar cells or spherical light-emitting elements are provided on a common film and are electrically connected thereto. In other words, the light reception or light-emitting function is only available on one side of the film, since the construction is such that the light-receiving layer or light-emitting layer is formed all together on only one side of the common film, or such that a plurality of light-receiving units or a plurality of light-emitting units that have been manufactured individually are disposed on only one side of the common film.

On the other hand, in Patent Document #3, there is disclosed a construction in which the light-receiving function or the light-emitting function is available on both sides of the device. In concrete terms, a flexible light-receiving or light-emitting device is disclosed in which a plurality of spherical semiconductor elements are electrically connected with conductive members (conducting lines), and are sealed with resin. For this device, a construction is proposed in which the cells in the column direction are connected in parallel in the vertical direction by a pair of conducting lines, and adjacent conducting lines in the row direction are connected in series by direct coupling. However, when tension is applied in the direction of series connection, the spherical semiconductor elements receive this tension directly, so that there is a danger of the spherical semiconductor elements being torn away.

And in Patent Document #4 a flexible solar battery module is disclosed, having a construction in which spherical semiconductor elements in which pn junctions are formed are solidly pressed into a plurality of meshes of a mesh like structural material (glass cloth) that is flat woven using conducting lines made from glass fibers coated with silver as horizontal strands and non conducting lines made from glass fiber as vertical strands, and, along with electrodes being formed by application of heat at high temperature in this state, also electrical connection of the mesh like structural material and the spherical semiconductor elements is simultaneously performed, and thereafter both sides of the mesh like structure are laminated with resin film.

However, with the manufacturing method of Patent Document #4, since the formation of the electrodes and establishment of the electrical connections between the mesh like structural material and the spherical semiconductor elements are performed simultaneously, accordingly there is the problem that testing for checking the functioning of the spherical semiconductor elements is not possible, because the pushing of the spherical semiconductor elements into the meshes of the mesh like structural material is not performed subsequently to formation of their electrodes. For this reason, even if faulty spherical semiconductor elements are mixed in with the others, this fact cannot be detected, and therefore the defect ratio of the solar battery module becomes high.

Furthermore, with the finished solar battery module, since the spherical semiconductor elements project on one of its surfaces, accordingly light from the rear surface of the solar battery module cannot be effectively utilized, and the light reception sensitivity for light that is incident from the rear surface becomes low, which is undesirable. Moreover, since the flexibility of the solar battery module when the module is mechanically bent is not symmetrical between its two sides but is biased towards one side, accordingly the convenience of use becomes bad.

Thus, with the manufacturing method of Patent Document #5, a light-receiving module in sheet form or a light-emitting module in sheet form that is transparent and flexible is manufactured by preparing a fabric that is flat woven as a mesh like construction from horizontal strands made from insulating filaments and vertical strands made from electrically conductive filaments, by inserting a plurality of spherical semiconductor elements that have a light-receiving function or a light-emitting function and that have positive electrodes and negative electrodes into a plurality of the net like meshes of the fabric in such a state that the polarities of their electrodes are lined up, by connecting the elements in parallel in the vertical direction (i.e. in the column direction) via pairs of conducting and connecting them in series in the horizontal direction (i.e. in the row direction by connecting between conducting lines in the row direction that are adjacent with conducting lines for series connection, and by sealing the resulting fabric within transparent resin sheets.

Since this light-receiving module or light-emitting module of Patent Document #5 is a module in which the spherical semiconductor elements are integrally installed in the fabric, accordingly it is a module which has a double sided light reception or double sided light emission characteristic and with which there is no bias towards either surface of the light reception or light emission module, and thus a flexible module is obtained both of whose sides have the same external appearance, and which moreover can be bent in both directions in a symmetrical manner.

Patent Document #1: U.S. Pat. No. 4,691,076
Patent Document #2: U.S. Pat. No. 5,469,020
Patent Document #3: PCT Laid Open Publication WO2004/001858
Patent Document #4: Japanese Laid Open Patent Publication Heisei 9-16243
Patent Document #5: PCT Laid Open Publication WO2005/041312

SUMMARY OF THE INVENTION

Now, when manufacturing the module of Patent Document #5 described above, in order to insert the plurality of spherical semiconductor elements into the net meshes of the fabric that is woven in advance, and in order to connect the positive and negative electrodes at the two ends of the spherical semiconductor elements and the vertical strands that consist of conducting lines together electrically with electrically conductive paste, it is necessary to keep the diameters of the semiconductor elements and the gaps in the mesh fixed.

However, when performing the task described above of inserting the spherical semiconductor elements into the meshes of the fabric which are kept in the dilated state, there is a danger that, during the work, the dimensions or the shape of the fabric will slump due to its own weight or the like, so that the spaces between the horizontal strands or between the vertical strands become too narrow and the spherical semiconductor elements become blocked in the meshes; and also, conversely to the above, there is a danger that a state will arise in which the spaces between the horizontal strands or between the vertical strands become too great, so that it is not possible to connect the positive and negative electrodes of the spherical semiconductor elements to the vertical strands with electrically conductive paste in an appropriate manner.

Moreover, with the structure of the module of Patent Document #5, a pair of vertical strands are provided for each column, and a constant gap is left between the vertical strand for the positive electrodes of each column and the vertical strand for the negative electrodes of the adjacent column, so that the structure is modularized. Due to this, in order to establish series connection between the plurality of spherical semiconductor elements in each column and the plurality of semiconductor elements in adjacent column, it is necessary to connect the end portions of the vertical strands in the length direction together via conducting lines for series connection. In other words, since it is necessary to provide conducting lines for series connection, which are additional separate members exterior to the modules, accordingly the number of components is increased, and considerable labor is required for the work of wiring and so on, so that the manufacturing cost is increased. Furthermore, there is a fear that the tensile strength and the bending strength will become low, due to the provision of unnecessary spaces between the columns.

Now, with a solar battery, a solar module, a solar panel or the like, there are some aspects that cannot be satisfied only by power generation efficiency and convenience of use of the product, or by durability and economy thereof. For example, with a light reception device that supplies electrical energy by receiving light from the exterior, or with a light emission device that converts electrical energy into light which it emits to the exterior, depending upon the application, there may be some factors in relation to the human interface that relate to human sensitivities When a solar battery is used by being attached to an electronic device that is visible to the public, or to a building, a train carriage or passenger car, clothes or personal equipment, then its presence exerts a great influence on the external appearance. Due to this, in some cases there is a requirement for some specific type of shape or characteristic corresponding to the application; for example, there may be a requirement for thinness, lightness, flexibility, optical transparency or see-through characteristic, or the like. Furthermore, apart from physical factors, it is desirable for the freedom in design, i.e. for the design aspects of coloration and handling pattern, to be high.

Objects of the present invention are to provide a method for manufacturing a woven mesh substrate with semiconductor elements to which a plurality of spherical semiconductor elements are installed during the weaving of that woven mesh substrate using a weaving machine, the method being capable of manufacturing a woven mesh substrate with semiconductor elements of stabilized quality, and to provide a device for manufacturing such a substrate; to provide a woven mesh substrate with semiconductor elements in which spherical semiconductor elements having a light-receiving, function or a light-emitting function are installed on the woven mesh substrate, with electrodes thereof being connected to conducting lines; to provide a woven mesh substrate with semiconductor elements that serves as an intermediate material that is capable of being employed for various applications; to provide a woven mesh substrate with semiconductor elements with which freedom of design can be enhanced; to provide a woven mesh substrate with semiconductor elements with which tensile strength and bending resistance can be enhanced.

The method for manufacturing a woven mesh substrate with semiconductor elements according to the present invention is a method for manufacturing a woven mesh substrate with attached semiconductor elements, in which a plurality of spherical semiconductor elements having a light-receiving function or a light-emitting function, and each having a first and a second electrode, are installed to a woven mesh substrate in net form that is woven from a plurality of vertical strands that are insulating and a plurality of horizontal strands that are electrically conductive, characterized by comprising: a first step of shifting, with a peddle mechanism, a first group of vertical strands including a plurality of vertical strands arranged mutually parallel with fixed gaps between them, and a second group of vertical strands including a plurality of vertical strands positioned parallel to the first group of vertical strands and alternatingly therewith, and creating a gap between the first and second groups of vertical strands; a second step of supplying, with a shuttle mechanism, a horizontal strand through the gap between the first and second groups of vertical strands; a third step of pushing, with a reed mechanism, the horizontal strand that has been supplied by the second process; a fourth step of applying conductive junction blobs at a plurality of sites corresponding to all or a part of the net meshes on the horizontal strand that has been reed pushed by the third step; a fifth step of installing a plurality of spherical semiconductor elements corresponding to all or a portion of the plurality of sites at which the conductive junction blobs have been applied by the fourth step, thus connecting a plurality of their first electrodes or of their second electrodes to the horizontal strand; and a sixth step of repeating the first step through the fifth step a plurality of times.

The device for manufacturing a woven mesh substrate with semiconductor elements according to the present invention is a device for manufacturing a woven mesh substrate with attached semiconductor elements in which a plurality of spherical semiconductor elements having to light-receiving function or a light-emitting function, and moreover each having a first and a second electrode, are installed to a woven mesh substrate in net form that is woven from a plurality of vertical strands that are insulating and a plurality of horizontal strands that are electrically conductive, characterized by comprising: a supply side guide roller that guides a plurality of vertical strands supplied from a vertical strand supply source; a heddle mechanism that shifts a first group of vertical strands including a plurality of vertical strands arranged mutually parallel with fixed gaps between them, and a second group of vertical strands including a plurality of vertical strands positioned parallel to the first group of vertical strands and alternatingly therewith, and creates a gap between the first and second groups of vertical strands; a shuttle mechanism that supplies a horizontal strand through the gap created by the heddle mechanism between the first and second groups of vertical strands; a reed mechanism that pushes the horizontal strand that has been supplied by the shuttle mechanism; an application mechanism that applies conductive junction blobs at a plurality of sites on the horizontal strand corresponding to all or a part of the net meshes; and a semiconductor element supply mechanism that installs a plurality of spherical semiconductor elements to correspond to all or a portion of the plurality of sites at which the conductive junction blobs have been applied, and that thus connects the plurality of first electrodes or of second electrodes to the horizontal strand.

Moreover, the woven mesh substrate with attached semiconductor elements according to the present invention is a woven mesh substrate with semiconductor elements, to which a plurality of spherical semiconductor elements having a light-receiving function or a light-emitting function are installed, characterized by comprising: a woven mesh substrate in net form, woven from a plurality of vertical strands that are insulating and a plurality of horizontal strands that are electrically conductive, and having meshes arranged in a plurality of rows and a plurality of columns; and a plurality of spherical semiconductor elements each of which has a light-receiving function or a light-emitting function and a first and a second electrode, and installed to a plurality of the meshes of the woven mesh substrate in a state in which their conductive directions as specified by the first and second electrodes are lined up in the vertical direction parallel to the vertical strands; and in that: the plurality of spherical semiconductor elements are grouped into a plurality of groups, taking row direction element groups comprising a plurality of spherical semiconductor elements lined up along the horizontal direction as units; the plurality of row direction element groups are arranged in the plurality of rows, with conductive connection members comprising one or a plurality of horizontal strands being disposed between adjacent row direction element groups; the plurality of spherical semiconductor elements of each row direction element group are electrically connected in parallel via a pair of the conductive connection members; and the plurality of row direction element groups are connected in series via a plurality of the conductive connection members.

Since, according to the manufacturing method, while weaving the woven mesh substrate from the plurality of vertical strands that are insulating and the plurality of horizontal strands that are electrically conductive using a weaving machine, the plurality of spherical semiconductor elements are installed to that woven mesh substrate, and their first and second electrodes are electrically connected to the horizontal strands with the conductive junction blobs, accordingly when manufacturing the woven mesh substrate, and when installing the spherical semiconductor elements, it is possible to automate the application of the conductive junction blobs, so that it is possible to manufacture a woven mesh substrate with semiconductor elements of stabilized quality efficiently with a small number of steps, and it is also possible to reduce the cost of manufacturing the woven mesh substrate with semiconductor elements.

And, according to the manufacturing device, apart from fundamentally obtaining similar advantageous effects described above, the following further beneficial effects are also obtained. Since it is possible to additionally provide an application mechanism and a semiconductor element supply mechanism while taking effective advantage of a supply side guidance roller, a peddle mechanism, and a reed mechanism of an already existing weaving machine, accordingly this is advantageous from the point of view of design, manufacture, and manufacturing cost of a manufacturing device for a woven mesh substrate with attached semiconductor elements, and it is possible to produce a manufacturing device for automatically manufacturing a woven mesh substrate with attached semiconductor elements.

And since, according to the invention of claim 16, with this woven mesh substrate with attached semiconductor elements, along with the plurality of spherical semiconductor elements being grouped into a plurality of groups by taking row direction element groups that consist of a plurality of spherical semiconductor elements arranged along the horizontal direction as units, and the plurality of row direction element groups being arranged in a plurality of rows, also the conductive connection members that consist of one or a plurality of horizontal strands are disposed between adjacent ones of the row direction element groups, and the plurality of spherical semiconductor elements in each of the row direction element groups are electrically connected in parallel via a pair of the conductive connection members, and the plurality of row direction element groups are connected in series via the plurality of conductive connection members, accordingly, in the case of a woven mesh substrate with attached semiconductor elements for light reception, it is possible to set the voltage of the electricity that is generated freely via the number of series connections, and also it is possible to set the current of the electricity that is generated freely via the number of parallel connections.

And since, in the case of a woven mesh substrate with semiconductor elements for light reception, the plurality of spherical semiconductor elements are connected in series in the vertical direction and also are connected in parallel in the horizontal direction, accordingly, even if it happens that some portion becomes partially shaded, it is possible to ensure that the influence that is exerted on the output of the other portion of the spherical semiconductor elements that is not shaded is still kept to the minimum limit.

Moreover, this woven mesh substrate with semiconductor elements is capable of light reception or light emission with equal efficiency from both its sides, both top and bottom. This woven mesh substrate with semiconductor elements is an intermediate manufactured product, that is flexible, light in weight, thin, bendable, see through, and translucent to daylight, and it can be finished into various types of final manufactured product, according to the application.

Furthermore, since it is not necessary to provide any separate conducting lines for series connection to the series connection construction of this woven mesh substrate with semiconductor elements, accordingly it is possible to reduce the number of components, so that it is possible to reduce the manufacturing cost. And, since it is possible to arrange the spherical semiconductor elements more closely together without providing any unnecessary gaps between the element groups, accordingly it is possible to enhance the tensile strength and the bending strength (resistance), while also being able to enhance the light reception performance or the light emission performance.

In addition to above described manufacturing method, it would also be acceptable to arrange to employ various additional steps of the following types.

(a) The transition to the third step may occur after having repeated the first step and the second step at least twice in succession.

(b) After the fifth step and before the sixth step, there may be provided a heat application step of applying heat to the conductive junction blobs.

(c) After the fifth step and before the sixth step, there may be provided a pulling out step of pulling out the woven mesh substrate with attached semiconductor elements by a predetermined length.

(d) After the fifth step and before the sixth step, there may be provided a covering step of covering both sides of the woven mesh substrate with attached semiconductor elements with protective insulating layers that are flexible and optically transparent.

(e) After the fifth step and before the sixth step, there may be provided an overlaying step of overlaying both sides of the woven mesh substrate with attached semiconductor elements with sheets of a synthetic resin material that are flexible and optically transparent, and then applying heat and pressure thereto.

(f) In the fourth step, first conductive junction blobs may be applied at a plurality of sites on the horizontal strand at which the plurality of spherical semiconductor elements are to be connected; in the fifth step, a plurality of spherical semiconductor elements may be installed corresponding to the plurality of sites at which the first conductive junction blobs have been applied, with the plurality of first electrodes thereof being connected to the plurality of sites; and, after the fifth step and before the sixth step, there may be provided an application step of applying second conductive junction blobs to the plurality of second electrodes of the plurality of spherical semiconductor elements.

(g) In the fourth step, a plurality of conductive junction blobs may be applied from the upper side of the horizontal strand; and, in the fifth step, a plurality of spherical semiconductor elements may be installed from the upper sides of the plurality of conductive junction blobs that were applied in the fourth step.

And, in addition to above described manufacturing device, it would also be acceptable to arrange to employ various additional elements or members of the following types.

(h) The application mechanism may comprise a first rotation drum and a plurality of L shaped dispensers that are fixed to the outer circumferential surface of the first rotation drum at fixed intervals along its axial direction, and that are adapted to pick up and distribute conductive junction blobs at their end portions.

(i) The semiconductor element supply mechanism may comprise a second rotation drum to the interior of which negative pressure can be supplied, and a plurality of air pincers that are made as L shaped pipe members, and that are fixed to the outer circumferential surface of this second rotation drum at fixed intervals along its axial direction.

(j) There may be provided a heat application mechanism that applies heat to and dries the conductive junction blobs.

(k) There may be provided a pulling out mechanism that pulls out the woven mesh substrate with semiconductor elements by successive predetermined lengths.

(l) There may be provided a protective layer covering mechanism that covers both sides of the woven mesh substrate with semiconductor elements with flexible and optically transparent protective insulating layers.

(m) There may be provided a heat application and pressurization mechanism that forms a woven mesh substrate with semiconductor elements sheet by applying heat and pressure to both sides of the woven mesh substrate with semiconductor elements, in the state in which they are overlaid with flexible and optically transparent sheets of synthetic resin material.

Moreover, in addition to above described wove mesh substrate with semiconductor elements, it would also be acceptable to arrange to employ various additional constitutions of the following types.

(n) Each of the conductive connection members may consist of a first and a second horizontal strand that are adjacent in the vertical direction so as to contact one another and are electrically connected together, each of which is woven in a zigzag state so as to contact front surfaces and rear surfaces of the plurality of vertical strands alternatingly; and the weaving pattern may sandwich the vertical strands by the first horizontal strands and the second horizontal strands from their front surfaces and their rear surfaces.

(o) First fabric portions of predetermined width in fabric form may be formed at both end portions of the woven mesh substrate in the lengthwise direction of the vertical strands by a plurality of horizontal strands that are arranged more tightly than in the meshes, and by the plurality of vertical strands; and second fabric portions of predetermined width in fabric form may be formed at both side portions of the woven mesh substrate in the lengthwise direction of the horizontal strands by a plurality of vertical strands that are arranged more tightly than in the meshes, and by the plurality of horizontal strands.

(p) Both sides of the woven mesh substrate and the plurality of spherical semiconductor elements may be covered over by protective insulating layers that are flexible and optically transparent.

(q) The woven mesh substrate and the plurality of spherical semiconductor elements may be sealed in an embedded manner within sheets of synthetic resin material that are flexible and optically transparent, and synthetic resin film layers that are flexible and optically transparent may be formed on both sides of the synthetic resin material sheets.

(r) The vertical strands may be made as bundles of glass fibers or synthetic resin fibers, and the horizontal strands may be made as conducting lines in which thin metallic wires are covered in the form of coils over the surfaces of bundles of glass fibers or synthetic resin fibers.

(s) The horizontal strands may be made as conducting lines consisting of bundles of electrically conductive carbon fibers, or as conducting lines in which thin metallic wires are covered in the form of coils over the surfaces of bundles of the carbon fibers.

(t) At least one insulating separation hand of predetermined width, in which a plurality of insulating lines are arranged in the horizontal direction more tightly than in the meshes, may be formed at an intermediate portion of the woven mesh substrate in the vertical direction.

DESCRIPTION OF THE PREFERRED EMBODIMENTS

In the following, the best mode for implementing the present invention will be explained on the basis of embodiments for implementation thereof.

Embodiment 1

First, the woven mesh substrate with semiconductor elements 1 of the present invention will be explained.

Figure 1:
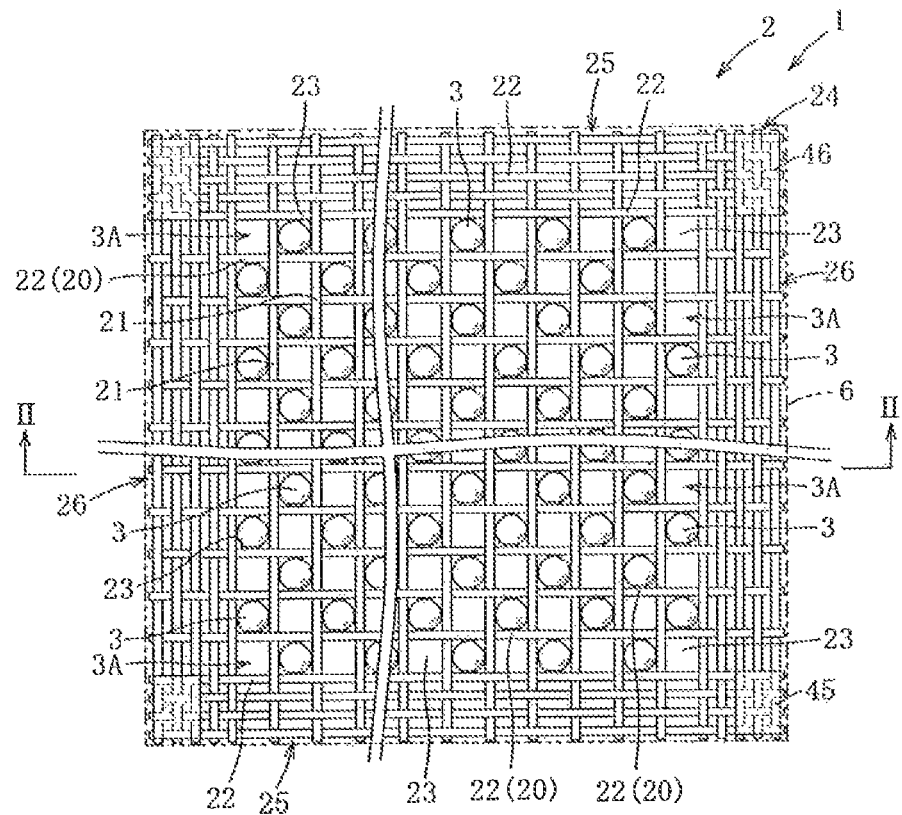
FIG. 1 is a plan view of a woven mesh substrate with attached semiconductor elements according to a first embodiment of the present invention.
Figure 2:
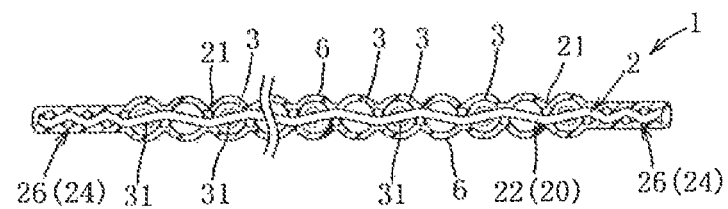
FIG. 2 is a sectional view taken along lines II-II of FIG. 1.
Figure 3:
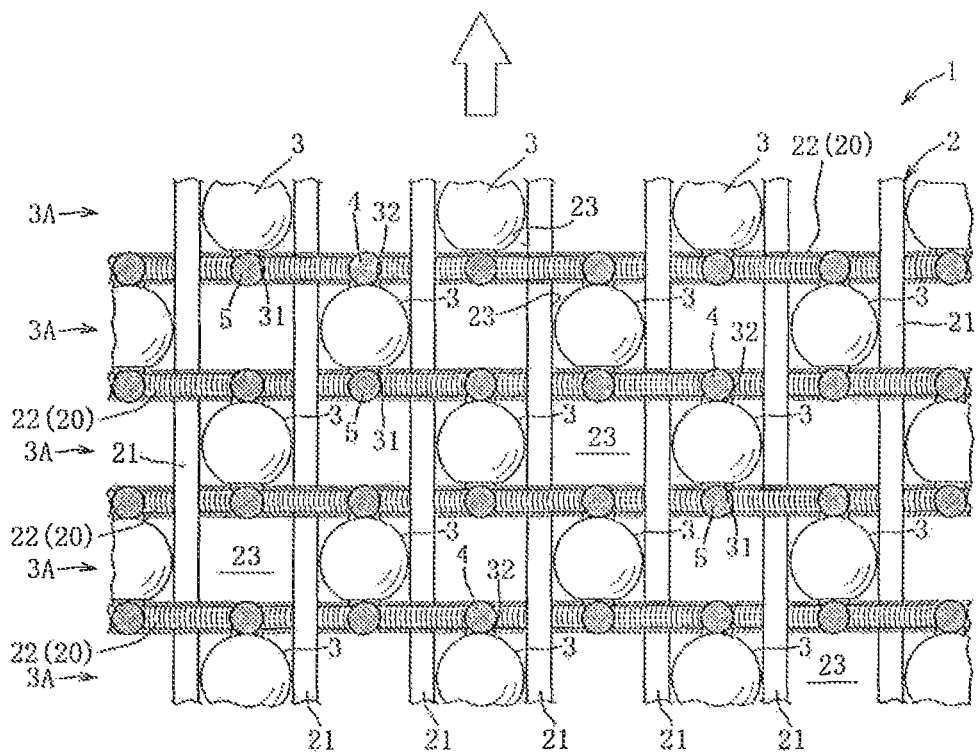
FIG. 3 is an enlarged plan view of essential portions of the woven mesh substrate with semiconductor elements.

As shown in FIGS. 1 through 3, the woven mesh substrate with semiconductor elements 1 (hereinafter termed the "woven mesh substrate with elements 1") comprises: a woven mesh substrate 2 that is formed as a net having meshes 23 in matrix form arranged in a plurality of rows and a plurality of columns, and woven from a plurality of vertical strands 21 that are insulating and a plurality of horizontal strands 22 that are conductive; a plurality of spherical solar cells 3 (which correspond to spherical semiconductor elements) that are installed to the plurality of meshes 23 of the woven mesh substrate 2; and a plurality of first and second conducting junction materials 4, 5 for connecting these spherical solar cells 3 to the horizontal strands 22 (i.e. to conductive connection members 20). Protective insulating layers 6 are formed on both the sides of the woven mesh substrate 2 and the plurality of spherical solar cells it should be understood that up, down, left, and right in FIG. 1 will be explained as being up, down, left, and right.

With the manufacturing method and the manufacturing device 50 described hereinafter, this woven mesh substrate with elements 1 can be woven continuously in the shape of a long belt. The woven mesh substrate with elements 1 can be manufactured while setting the number of spherical solar cells that are installed to the woven mesh substrate 2 and their pattern of arrangement and their size and so on appropriately, according to specification.

This woven mesh substrate with attached elements 1 is flexible, and its optical transmission capability (i.e. its optical transmittivity) can be adjusted by adjusting the ratio of the number of meshes 23 to which the plurality of spherical solar cells 3 are installed to the number of meshes 23 to which they are not installed. With the woven mesh substrate with elements 1 of FIG. 1, a spherical solar cell 3 is installed to every second location along each row in the left and right direction of the meshes 23, and a spherical solar cell 3 is installed to every second location along each column in the up and down direction of the meshes 23.

Next, the woven mesh substrate 2 will be explained.

As shown in FIGS. 1 through 3, the woven mesh substrate 2 comprises the plurality of mutually parallel vertical strands 21 that extend in the column direction (the vertical direction in FIG. 1), the plurality of horizontal strands 22 that extend in the row direction (the horizontal direction in FIG. 1) and that are woven between the plurality of vertical strands 21 so as to be orthogonal to the plurality of vertical strands 21, and the meshes 23 in a plurality of rows and columns that are surrounded by this plurality of vertical strands 21 and this plurality of horizontal strands 22; and thus the woven mesh substrate 2, to which the spherical solar cells 3 can be installed, is defined by this plurality of vertical strands 21 and this plurality of horizontal strands 22. Each of the meshes 23 is formed in a square shape as seen in plan view, with the length of each of its sides being set to around 1.8 mm, which is approximately the same as the diameter of the solar cells 3.

As shown in FIGS. 1 and 2, a margin portion 24 which is woven without installing any spherical solar cells 3 thereto is formed around the exterior portion of this woven mesh substrate 2. This margin portion 24 is formed from first fabric portions 25 of predetermined width that are defined in fabric form, at both end portions of the vertical strands 21 in their length direction, by a plurality of the horizontal strands 22 that are arranged as a tighter net than in the mesh 23 and by the plurality of vertical strands 21, and from second fabric portions 26 of predetermined width that are defined in fabric form, at both end portions of the horizontal strands 22 in their length direction, by a plurality of the vertical strands 21 that are arranged as a tighter net than in the mesh 23 and by the plurality of horizontal strands 22. In these first fabric portions 25 the gaps between adjacent ones of the horizontal strands 2q2 are around ⅓ of the mesh width and similarly in the second fabric portions 26 the gaps between adjacent ones of the vertical strands 21 are around ⅓ of the mesh width.

Since the density of weaving of the vertical strands 21 or of the horizontal strands 22 is higher in this margin portion 24, accordingly the tensile strength and the bending strength are enhanced, and the durability of the woven mesh substrate 2 also becomes higher. Moreover, if the woven mesh substrate 2 is being manufactured in the shape of a long belt, then, by providing the two first fabric portions 25 successively at predetermined locations, it is possible, when this fabric is to be cut to a required length, to perform the cutting according to the shape in which the margin portion 24 is provided; and it is also possible for the solar cells 3 to be protected by the margin portion 24 during handling of the woven mesh substrate 2 after it has been cut.

Next, the vertical strands 21 will be explained.

Figure 6:
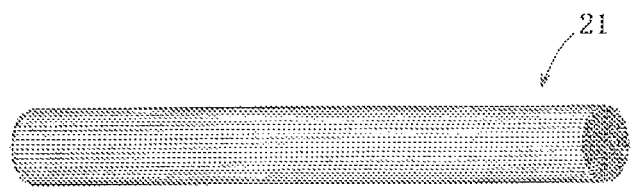
FIG. 6 is an enlarged perspective view of a portion of an insulating line.

As shown in FIG. 6, the vertical strands 21 are made from, for example, glass fiber or a synthetic resin fiber (for example polyester, aramid, polyethylene, a liquid crystal polymer, or the like). In this embodiment, the vertical strands 21 are made as lines including a plurality of glass fibers (of diameter, for example, around 0.3 mm) bundled or twisted together. It should be understood that, by employing glass fiber for the vertical strands 21 and the horizontal strands 22, it is possible to obtain vertical strands 21 and horizontal strands 22 whose mechanical strength is high and whose heat resistance is excellent.

Next, the horizontal strands 22 will be explained.

Figure 5:
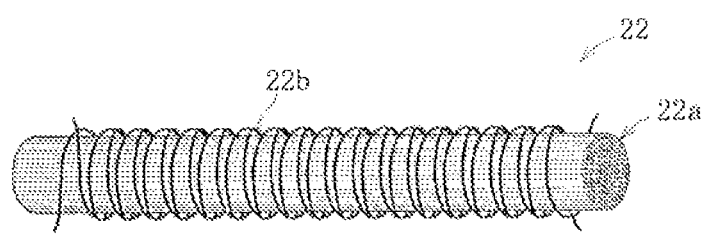
FIG. 5 is an enlarged perspective view of a portion of a conducting line.

As shown in FIG. 5, each of the horizontal strands 22 is made by forming a bundle of, for example, glass fibers or synthetic resin fibers (for example polyester, aramid, polyethylene, a liquid crystal polymer, or the like) as a core fibers 22a, and by winding thin metallic wires 22b of copper or the like thereon in the form of coils, in this embodiment, the horizontal strands 22 are made by covering the surface of the core fibers 22a that consists of a plurality of glass fibers (of diameter, for example, around 0.5 mm) with two thin metallic wires 22b of diameter 0.05 mm (for example thin wires of copper) whose surfaces are plated with silver, in the form of two coils. The two thin metallic wires 22b are wound left and right, so that they cross one another. Since these horizontal strands 22 are made by winding the two thin metallic wires 22b in the form of coils, accordingly they can be bent to and fro in any direction, and moreover they have high durability even if they are bent repeatedly to and fro. It should be understood that the number of thin metallic wires 22 is not limited to being two as the covering, it would also be acceptable to use a plurality of more than two thin metallic wires formed as coils.

Next, the spherical solar cells 3 will be explained.

As shown in FIG. 3, the plurality of spherical solar cells 3 (hereinafter termed "solar cells 3") have a light-receiving function (i.e. they are capable of generating electricity), and each comprises a positive electrode 31 (i.e. a second electrode) and a negative electrode 32 (i.e. a first electrode) and is attached in one of the plurality of meshes 23 of the woven mesh substrate 2, so that their conductive directions specified by their positive electrodes 31 and negative electrodes 32 are lined up along the direction parallel to the vertical strands 21. The vertical strands 21 are positioned on both sides of the solar cells 3 in the row direction, i.e. on their left and right sides, and the horizontal strands 22 are positioned on both sides of the solar cells 3 in the column direction, i.e. above and below them.

Figure 4:
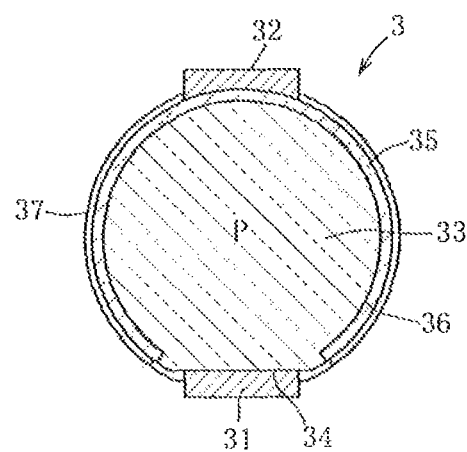
FIG. 4 is a sectional view of a spherical solar cell.

As shown in FIG. 4, each of the solar cells 3 includes: a p type spherical semiconductor 33; a flat surface 34 formed on a portion of the surface of the spherical semiconductor 33; a pn junction 36 shaped as a spherical surface that is made by forming an n type diffused layer 35 on an outer layer portion of the spherical semiconductor 33; an electrode pair consisting of a positive, electrode 31 (i.e. a second electrode) and a negative electrode 32 (i.e. a first electrode) that are fixed so as to oppose one another across the center of the spherical semiconductor 33, and that are electrically connected to the two sides of the pn junction 36; ands reflection prevention layer 37 that is formed over all portions of the structure other than the positive electrode 31 and the negative electrode 32.

Now, a method for manufacturing these solar cells 3 will be explained in a simple manner.

First, a small spherical p type silicon crystal (i.e. the spherical semiconductor 33) is prepared, having diameter of from around 1.0 mm to around 2.0 mm (in this embodiment 1.8 mm). In order to manufacture this p type silicon crystal, for example, a small lump of p type silicon crystal is melted, and the resulting liquid drop is allowed to cool and solidify while it is kept as spherical as possible by surface tension. It should be understood that the spherical silicon semiconductor crystal may be a single crystal, or may be a polycrystal.

Next, a portion of this spherical silicon crystal is cut away to provide the flat surface 34, and an SiO2 layer is formed as a diffusion mask on the surface of this flat surface 34 and around a portion surrounding it. Thereafter, the pn junction 36 that is formed as a spherical surface is made by diffusing are n type impurity inward from the outer layer portion of the p type silicon crystal to a depth of around 0.5 μm to around 1.0 μm, with the exception of the portion that has been masked by this SiO2 layer, so that this portion is converted into the n type diffused layer 35.

Next, after this impurity diffusion, the oxide layer is eliminated as far as possible, and the reflection prevention layer 37 is made by sequentially forming layers of SiO2 and Si3N4 over the entire surface. And next a conductive paste, whose principal components are glass frit and silver, is printed on the flat surface 34 described above in the form of a dot, and moreover a conductive paste including glass frit, aluminum, and silver is printed in the form of a dot on the summit surface of the n type diffused layer 35, opposite to the flat surface 34 and with the center of the spherical semiconductor 33 between them.

And heat is applied at 800° C. for a short time period (around one to two minutes) in an atmosphere of inert gas. Due to this processing, the electrode members that include glass frit pierce through the reflection prevention layer 37, and thereby the positive electrode 31 and the negative electrode 32 are formed to be in ohmic contact with the p type semiconductor surface and the n type semiconductor surface. The plurality of spherical solar cells 3 are manufactured in this manner.

This spherical solar cell 3 is an element having the following characteristics.

First, the spherical crystal is formed by taking advantage of the surface tension of the silicon crystal material, and it will be sufficient only to use a small amount of silicon raw material, since the spherical solar cell 3 can be manufactured with low grinding processing loss. Moreover, since the positive electrode 31 and the negative electrode 32 are provided in the form of dots so as to oppose one another along the center line of the spherical silicon crystal, accordingly light from almost all directions can be received and generates electricity, except for light from directly above the axial line that connects the two electrodes. Thus not only is the same general level of output received even if the direction of incidence of the light changes, but, apart from this, it is also possible to receive both reflected light and scattered light at the same time, so that the light reception characteristic is more excellent than that of a planar light reception type solar cell. As a result, high output is obtained.

Next, the first and second conductive junction materials 4, 5 will be explained. As shown in FIG. 3, each of the plurality of first conductive junction material 4 is connected between the negative electrode 32 of one of the solar cells 3 and one of the horizontal strands 22, while each of the plurality of second conductive junction material 5 is connected between the positive electrode 31 of one of the solar cells 3 and one of the horizontal strands 22. The conductive junction materials 4, 5 are made from a silver paste (one in which silver powder is mixed into epoxy resin). When connecting the solar cells 3 and the horizontal strands 22 (i.e. the conductive connection members 20) together with this silver paste, for example, after having applied the silver paste to the junction sites between the positive electrodes 31 and the horizontal strands 22 and to the junction sites between the negative electrodes 32 and the horizontal strands 22, the silver paste is hardened by application of heat using a heat application mechanism 61 that will be described hereinafter and is thus dried, and thereby it is possible to connect the positive electrodes 31 and the negative electrodes 32 of the solar cells 3 to the horizontal strands 22 electrically, and moreover to adhere them mechanically thereto.

Now, the series parallel connection construction (circuit) of the plurality of solar cells 3 will be explained.

As shown in FIGS. 1 through 3, the plurality of solar cells 3 are grouped into a plurality of groups in which row direction element groups 3A consisting of a plurality of the solar cells 3 arrayed along the horizontal direction (i.e. along the row direction) may be taken as units, so that along with this plurality of row direction element groups 3A being arranged in a plurality of rows, conductive connection members 20 are disposed between adjacent row direction element groups 3A. The conductive connection member 20 consists of single horizontal strand 22. The plurality of solar cells 3 in each of the row direction element groups 3A are electrically connected in parallel via its corresponding pair of two conductive connection members 20, and the plurality of row direction element groups 3A are connected in series via the plurality of conductive connection members 20.

Since it is possible to connect the plurality of solar cells 3 of adjacent row direction element groups 3A in series in this manner via the conductive connection member 20 that consists of the single horizontal strand 22 accordingly it is possible to arrange the plurality of row direction element groups 3A that are disposed in a plurality of rows in a state in which they are closely contacted together with no gaps being present, between them in the column direction. Due to this, it is possible to manufacture a woven mesh substrate with elements 1 on which a large quantity of the solar cells 3 are installed, and it is thus possible to enhance the light-receiving performance of the woven mesh substrate with elements 1. It should be understood that, if the solar cells 3 are replaced by light-emitting diodes, then it is possible to enhance the light-emitting performance.

Next, the protective insulating layers 6 will be explained.

As shown in FIGS. 1 and 2, these protective insulating layers 6 are coatings that cover both the upper and lower sides of the woven mesh substrate with elements 1 to a thickness of, for example, around 25 µm with a surface coating made from, for example, a silane coupling compound, or with a layer of parylene (product name, made by the Union Carbide Chemicals and Plastics Co.) which is a para xylylene series polymer. These protective insulating layers 6 are flexible and transparent to light. After the woven mesh substrate with elements 1 has been manufactured, protective insulating layers 6 that are made from a silane coupling compound may be formed as coatings according to a spray method by a protective layer covering mechanism 62 that will be described hereinafter. It should be understood that, after the woven mesh substrate with elements 1 has been manufactured, protective insulating layers 6 that are made from parylene may be formed as coatings at normal temperature according to a chemical vapor deposition method by a parylene protective layer covering mechanism not shown in the figures.

Since, in the interior of a solar battery module or of a solar cell panel to which the woven mesh substrate with elements 1 is installed, the solar cells 3 that can receive light three dimensionally can easily receive direct sunlight and also light that has been reflected and scattered, accordingly the efficiency of utilization of light incident from the exterior is high, and moreover a high stabilized output is obtained. In particular, the reduction in output is small when the direction of incidence of direct sunlight changes, or when the weather becomes overcast, and the total amount of electricity that is generated becomes great as compared to the case of a planar type solar battery module on which the light-receiving is performed two dimensionally. Moreover, it is possible to make a woven mesh substrate with elements which has excellent freedom in design by employing colored insulating lines in the woven mesh substrate with elements 1, by installing colored ornamental spheres of the same size as the solar cells 3 in some of the meshes 23, and so on.

Furthermore, in order to connect the woven mesh substrate with attached elements 1 electrically and mechanically to an external device, it is possible to connect the plurality of horizontal strands 22 to integrated terminals 45, 46 by connecting together the plurality of horizontal strands 22 at both the left, and right end portions of the lower side first fabric portion 25 with solder or silver paste, and by connecting together the plurality of horizontal strands 22 at, both the left and right end portions of the upper side first fabric portion 25 with solder or silver paste. It is possible to implement a woven mesh substrate with attached elements having a larger output of electrical power by connecting an appropriate number of the woven mesh substrates with elements 1 in parallel and/or in series using such external terminals 45,46. It should be understood that it would also be acceptable to combine and integrate together a plurality of the horizontal strands 22 with solder or silver paste at a plurality of locations on the upper and lower first fabric portions 25 along the horizontal direction. In this case, since not only is the strength of the first fabric portions 25 enhanced but also the electrical current from the plurality of solar cells 3 is outputted via the bundles of combined horizontal strands 22 and from the external terminals 45, 46, accordingly it is possible to alleviate the current load on the most inward ones of the horizontal strands 22 of the first fabric portions 25, which are the ones that are adjacent to the plurality of solar cells 3.

Since, in the woven mesh substrate with elements 1, the solar cells 3 are electrically and mechanically connected by being installed in the meshes 23 that are surrounded by the vertical strands 21 and the horizontal strands 22 that have the same structure as the fabric, accordingly it is sufficient to employ a lower number of essential members, and it is possible to reduce the cost of the material and of processing, so that it is possible to realize significant economy. Moreover, it is possible to make the woven mesh substrate with elements 1 thin and light, and it is possible to endow it with a flexible construction which is also see through.

Next, a manufacturing device 50 for manufacturing the woven mesh substrate with elements 1 will be explained.

Figure 7:
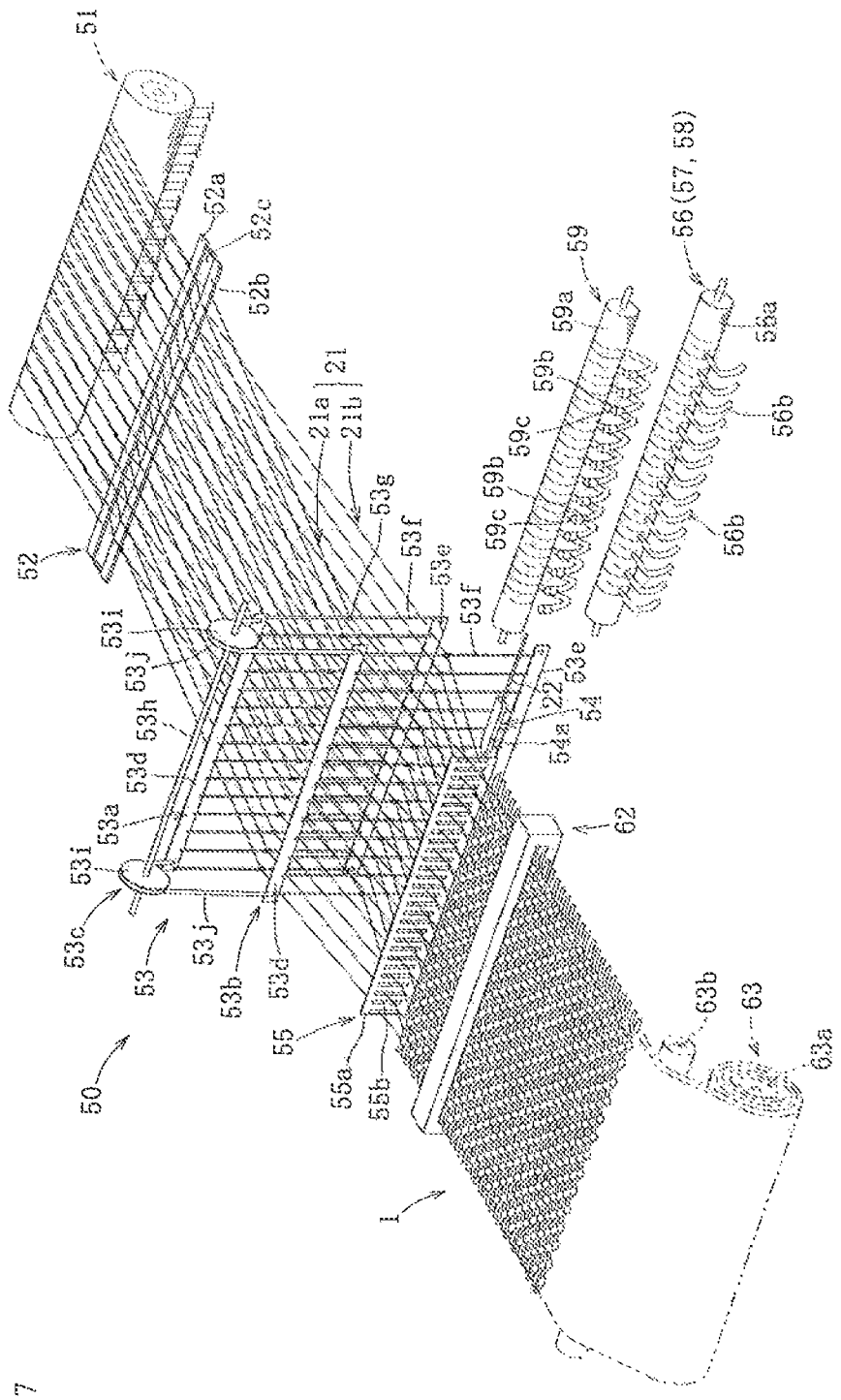
FIG. 7 is a perspective view of a device for manufacturing the woven mesh substrate with semiconductor elements.
Figure 8:
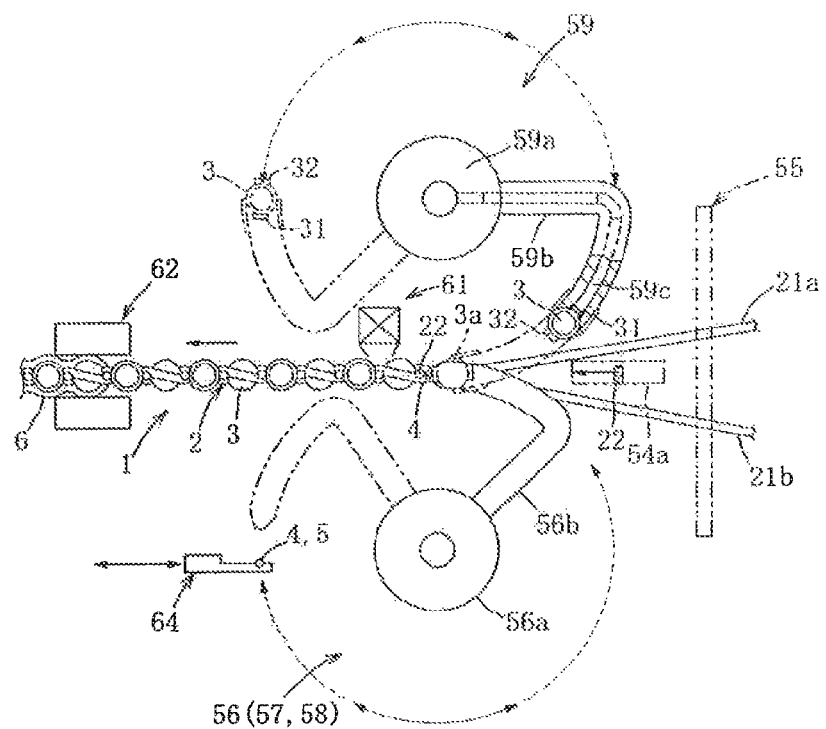
FIG. 8 is an enlarged sectional view of principal portions of an application mechanism and of a semiconductor element supply mechanism of the device for manufacturing a woven mesh substrate with semiconductor elements.

As shown in FIGS. 7 and 8, the manufacturing device 50 is able to manufacture the woven mesh substrate with elements 1 while shifting the resulting material from the upstream side towards the downstream side. The manufacturing device 50 comprises a supply side guide roller 51 at the farthest upstream side, a heddle mechanism 53, a shuttle mechanism 54, a reed mechanism 55, an application mechanism 56 that functions as a first application mechanism 57 and a second application mechanism 58, a semiconductor element supply mechanism 59, a heat application mechanism 61 (not shown in FIG. 7), a protective layer covering mechanism 62, a pulling out mechanism 63 at the farthest downstream side, and so on.

This manufacturing device 50 is a machine that manufactures a woven mesh substrate with elements 1 in which a plurality of solar cells 3 that have the function of receiving light, and each of which moreover has a positive electrode 31 and a negative electrode 32, are installed to a woven mesh substrate that is woven in net form from a plurality of vertical strands 21 that are insulating and a plurality of horizontal strands 22 that are electrically conductive, and that has meshes 23 laid out in matrix form in a plurality of rows and a plurality of columns. It should be understood that, in FIG. 7, the margin portion 24 of the woven mesh substrate with attached elements 1 is omitted.

Next, the supply side guide roller 51 will be explained.

As shown in FIG. 7 the supply side guide roller 51 is rotatably supported on the frame of the manufacturing device 50, and is rotationally driven by a roller drive mechanism (not shown). This supply side guide roller 51 is a mechanism that guides a plurality of vertical strands 21 that are supplied from a vertical strand supply source (not shown) towards the heddle mechanism 53 in a well ordered state, while changing their directions. While the plurality of vertical strands 21 are arranged with gaps of around 1.8 mm between them in the axial direction of the supply side guide roller 51, except for a number thereof that are positioned closely together at the two side end portions of the plurality of vertical strands 21 (corresponding to the second fabric portions 26), this gap value is not to be considered as being particularly imitative; it can be changed as appropriate, according to the configuration for the woven mesh substrate with elements 1. It should be understood that the gaps between the vertical strands 21 in the portions that define the second fabric portions 26 of the woven mesh substrate with elements 1 are around 0.6 mm, although this is not shown in the figure.

A guide plate 52 is provided between the supply side guide roller 51 and the heddle mechanism 53 at its downstream side. This guide plate 52 has a pair of flat plate portions 52a, 52b and an opening portion 52c that is defined between the pair of flat plate portions 52a, 52b and that extends in the lengthwise direction orthogonal to the vertical strands 21. This guide plate 52 divides the plurality of vertical strands 21 into two groups: a first group of vertical strands 21a that pass over the upper side of the that plate portion 52a, pass through the opening portion 52c, and pass under the under side of the flat plate portion 52b; and a second group of vertical strands 21b that pass under the under side of the flat plate portion 52a, pass through the opening portion 52c, and pass over the upper side of the flat plate portion 52b. It should be understood that, in this embodiment, in the plurality of vertical strands 21, the odd numbered vertical strands 21 from the right side edge in FIG. 7 are taken as being the first group of vertical strands 21, while the even numbered vertical strands 21 are taken as being the second group of vertical strands 21.

Next, the heddle mechanism 53 will be explained.

As shown in FIG. 7, the heddle mechanism 53 comprises first and second heddle members 53a, 53b, and a reciprocating drive member 53c for reciprocatingly shifting these first and second heddle members 53a, 53b relatively up and down. This heddle mechanism 53 is a device that shifts up and down the first group of vertical strands 21a including its plurality of vertical strands 21 arranged in parallel with predetermined gaps between them, and the second group of vertical strands 21b including its plurality of vertical strands 21 that are parallel to the first group of vertical strands 21a and that are positioned alternatingly with them, thus forming a gap for passing a shuttle 54a between the first and second groups of vertical strands 21a, 21b.

Each of the first and second heddle members 53a, 53b comprises a long and narrow plate shaped upper frame 53d a lower frame 53e, and a plurality of healds 53f that extend in the vertical direction and join the upper frame 53d and lower frame 53e. Strand holes 53g are formed in the central portions of the healds 53f for passing the vertical strands 21. The heddle mechanism 53 is constructed so that the first and second heddle members 53a, 53b are somewhat mutually deviated in the horizontal direction (i.e. in the width direction of the woven mesh substrate with elements 1), and so that the plurality of healds 53f of the second heddle member 53b are positioned between the plurality of healds 53f of the first heddle member 53a. Each of the plurality of vertical strands 21 of the first group of vertical strands 21a is passed through one of the plurality of strand holes 53g of the first heddle member 53a, and similarly each of the plurality of vertical strands 21 of the second group of vertical strands 21b is passed through one of the plurality of strand holes 53g of the second heddle member 53b. It should be understood that it would also be acceptable to adopt a structure for the heddle mechanism 53 in which a pair of upper and lower carrier rods are provided to the upper frame 53d and to the lower frame 53e respectively, and the healds 53f are supported by these carrier rods.

The reciprocating drive member 53c comprises a rotation shaft 53h that extends in the direction orthogonal to the vertical strands 21, a pair of pulley members 53i that are fixed to the two end portions of the shaft 53h, a pair of belt members 53j that are engaged over these pulley members 53i and are linked to the upper end portions of the first and second heddle members 53a, 53b, a reciprocating rotation mechanism (not shown) that rotates the rotation shaft 53h to and fro in a reciprocating manner, and so on. Due to this reciprocating operation of the reciprocating drive member 53c, when the first heddle member 53a and the first group of vertical strands 21a are shifted upwards, the second heddle member 53b and the second group of vertical strands 21b shift relatively downwards; and, when the first heddle member 53a and the first group of vertical strands 21a are shifted downwards, the second heddle member 53b and the second group of vertical strands 21b shift relatively upwards; and, in either case, a gap is formed between the first and second groups of vertical strands 21a, 21b for the shuttle member 54a to pass through. While this feature is omitted from FIG. 7, it should be understood that, below the first and second heddle members 53a, 53b, the reciprocating drive member 53c has a rotation shaft that is rotated to and fro in a reciprocating manner by a reciprocating rotation mechanism in the same way as the rotation shaft, a pair of pulley members that are fixed to the two end portions of this rotation shaft in the same way as the pair of pulley members 53i, a pair of belt members that are engaged over these pulley members and are linked to the lower end portions of the first and second heddle members 53a, 63b, and so on.

Next, the shuttle mechanism 54 will be explained.

As shown in FIG. 7, the shuttle mechanism 54 comprises a shuttle member 54a to which the end portion of a horizontal strand 22 is attached, a shuttle drive mechanism (not shown) that can drive the shuttle member 54a to reciprocate to and fro in the left and right direction, a horizontal strand supply mechanism (not shown) that supplies the horizontal strand 22 to the shuttle member 54a, and so on. The horizontal strand 22 is supplied by the shuttle member 54a into the wedge shaped gap created by the heddle mechanism 53 between the first and second groups of vertical strands 21a, 21b. In concrete terms, first, the shuttle member 54a is shifted from the right side in FIG. 7 to the left side through the gap between the first and second groups of vertical strands 21a, 21b, so that the horizontal strand 22 is passed through in a state orthogonal to the first and second groups of vertical strands 21a, 21b, and then the horizontal strand 22 is cut off at both left and right sides, while leaving portions corresponding to the second fabric portions 26.

Next, the reed mechanism 55 will be explained.

As shown in FIGS. 7 and 8, the reed mechanism 55 comprises a plate shaped member 55a that is oriented vertically and is elongated in the horizontal direction, and a reed drive mechanism (not shown) that shifts the plate shaped member 55a forwards and backwards through just a predetermined stroke, and a plurality of vertically extending slits 55b are formed at regular intervals in the plate shaped member 55a. The reed mechanism 55 is a device that, using a guide, strikes the horizontal strands 22 that have been supplied by the shuttle mechanism 54 so as to push and tamp them towards the downstream side, and that, along with regulating the horizontal strands 22 into an orthogonal state with respect to the vertical strands 21, also tightly packs the horizontal strands 22 against the solar cells 3 on the downstream side. The plurality of vertical strands 21 of the first group of vertical strands 21a pass through alternate one of the plurality of slits 55b, and the plurality of vertical strands 21 of the second group of vertical strands 21b pass through the other alternate ones of the slits 55b.

Next the application mechanism 56 will be explained, this being a combination of the first application mechanism 57 and the second application mechanism 58.

As shown in FIGS. 7 and 8, the first application mechanism 57 is a device that applies first conductive junction blobs 4 at a plurality of sites on the horizontal strands 22 that have been tamped by the reed, so as to connect them to the plurality of negative electrodes 32 of the plurality of solar cells 3. And, while the second application mechanism 58 is a device that applies second conductive junction blobs 5 to the plurality of positive electrodes 31 of the plurality of solar cells 3 that have been installed by the semiconductor element supply mechanism 59, in this embodiment, the first and second application mechanisms 57,58 are constituted as a single common application mechanism 56.

As shown in FIG. 8, the application mechanism 56 is disposed at the downstream side of the reed mechanism 55, and is located below the woven mesh substrate 2 that has been woven from the plurality of vertical strands 21 and the plurality of horizontal strands 22. However, in FIG. 7, this mechanism is shown in a disassembled state.

The application mechanism 56 comprises a first rotation drum 56a that is capable of being rotationally driven by just a predetermined angle (around 270°), and a plurality of L shaped dispensers 56b that are fixed to the outer circumferential surface of the first rotation drum 56a at fixed intervals along its axial direction. The plurality of dispensers 56b of this embodiment are fixed at every second pitch, corresponding to the diameter of the solar cells 3.

The first rotation drum 56a is rotatably supported on the frame of the manufacturing device 50 (not shown), and is rotationally reciprocatingly driven by a drum rotation drive mechanism (not shown). It should be understood that the application mechanism 56 also includes a reciprocating drive mechanism (not shown) that can shift the first rotation drum 56a to and fro by just a predetermined small stroke in its axial direction (for example, one pitch).

As shown in FIG. 8, the dispensers 56b are formed in L shapes. Each of the dispensers 56b is made so as to be capable of picking up and dispensing a conductive junction blob 4, 5 at its end portion. When the plurality of dispensers 56b are to pick up the plurality of conductive junction blobs 4, 5, in the state in which each of the dispensers 56b is in its pickup position, a plurality of the conductive junction blobs 4, 5 are supplied to positions below the end portions of the dispensers 56b by a supply mechanism 64 that can slide in the direction of the arrow sign in FIG. 8, and each of the conductive junction blobs 4, 5 is then picked up at the end portion of one of the dispensers 56b by the first rotation drum 56a being rotated slightly in the anticlockwise direction. It should be understood that, for the dispensers 56b, it would also be acceptable to employ devices that pick up the conductive junction blobs 4, 5 with air at negative pressure, thus distributing the conductive junction blobs 4, 5 with negative pressurized air.

Next, the semiconductor element supply mechanism 59 will be explained. As shown in FIG. 8, the semiconductor element supply mechanism 59 is disposed at the downstream side of the reed mechanism 55, and above the woven mesh substrate 2. However, in FIG. 7, this mechanism 59 is shown in a disassembled state.

The semiconductor element supply mechanism 59 comprises a second rotation drum 59a that can be driven by predetermined rotational angles and to the interior of which negative pressure is supplied, and a plurality of air pincettes 59b formed in L shapes that are fixed to the outer circumferential surface of the second rotation drum 59a with fixed gaps between them. The plurality of air pincettes 59b are fixed with intervals between them that are approximately twice the diameter of the solar cells 3. The semiconductor element supply mechanism 59 is a device that, by installing the plurality of solar cells 3 to the woven mesh substrate 2 so that they correspond to the plurality of locations on the horizontal strands 22 at which the first conductive junction blobs 4 are applied, connects the plurality of negative electrodes 32 at the respective plurality of locations described above.

The second rotation drum 59a is supported on the frame not shown in the figure of the manufacturing device 50 so that it can be rotationally driven, and is reciprocatingly rotationally driven to and fro by a reciprocating rotation drive mechanism (not shown). Negative pressure can be introduced into the interior of the second rotation drum 59a by a negative pressure generation mechanism not shown in the figures. This second rotation drum 59a can be changed over to a holding position (shown in FIG. 8 by the double dotted chain lines) in which it receives and holds a solar cell 3 from an external supply mechanism, and to a loading position (the position of the solar cell 3a at the rightmost side in FIG. 8) in which it is rotated by, for example, around 270° in the clockwise direction from the holding position, and in which it joins the solar cell 3 to one of the first conductive junction blobs 4. It should be understood that the semiconductor element supply mechanism 59 operates together with the first rotation drum 56a of the application mechanism 56, and also includes a reciprocating drive mechanism (not shown) for shifting the second rotation drum 59a to and fro by just a predetermined small stroke in its axial direction (with one pitch being equal, for example, to the diameter of the solar cells 3).

As shown in FIG. 8, the air pincettes 59b are made as L shaped pipe members. Nozzles 59c are formed at the end portions of the air pincettes 59b, and these are connected to the interior of the second rotation drum 59a via negative pressure conduction passages. When the solar cells 3 are to be held by the air pincettes 59b, the solar cells 3 are supplied to the end portions of the air pincettes 59b after having been positioned by a supply mechanism (not shown) into a predetermined attitude the attitude in which the negative electrodes 32 are on top and the positive electrodes 31 are underneath); and, since negative pressure is generated at the nozzles 59c at the end portions of the air pincettes 59b when negative pressure is introduced into the interior of the second rotation drum 59a, accordingly their end portions pick up and hold the positive electrode 31 sides of the solar cells 3 due to this negative pressure.

Next, the heat application mechanism 61 will be explained. As shown in FIG. 8, the heat application mechanism 61 is disposed in the neighborhood of the application mechanism 56 and the semiconductor element supply mechanism 59. This heat application mechanism 61 is a device that, after the solar cells 3 have been installed to the woven mesh substrate 2, causes the conductive junction blobs 4, 5 at the junction portions between the solar cells 3 and the horizontal strands 22 to harden in a short period of time. In concrete terms, the heat application mechanism 61 irradiates the conductive junction blobs 4, 5 locally with hot air or infrared radiation, so that heat is applied to them and they are dried and hardened.

Next, the protective layer covering mechanism 62 will be explained. As shown in FIGS. 7 and 8, the protective layer covering mechanism 62 has a tunnel shaped passage aperture, and is disposed downstream from the heat application mechanism 61. While the woven mesh substrate with elements 1 is passing through the passage aperture, both the upper and lower sides of the woven mesh substrate with elements 1 are covered by a spray method with protective insulating layers 6 that are flexible and optically transparent (i.e. with surface coatings of a silane coupling compound).

Next, the pulling out mechanism 63 will be explained.

As shown in FIG. 7, the pulling out mechanism 63 comprises a winding up roller 63a that winds up the woven mesh substrate with elements 1, a guide roller 63b that guides the woven mesh substrate with elements 1 in the direction of the winding up roller 63a, and so on, and is disposed at the furthest downstream side of the manufacturing device 50. The winding up roller 63a is supported on the frame (not shown) of the manufacturing device 50 so as to be capable of being rotationally driven, and operates together with the other mechanisms such as the application mechanism 56, the semiconductor element supply mechanism 59, and so on, so as to wind up the woven mesh substrate with elements 1 onto the winding up roller 63 with a pulling out drive mechanism (not shown), while intermittently pulling it out one pitch at a time.

Next, the manufacturing method for manufacturing the woven mesh substrate with elements 1 will be explained.

This manufacturing method is a method for manufacturing, with the manufacturing device 50, a woven mesh substrate with elements 1 in which a plurality of solar cells 3, having a function of light reception and each having a positive electrode 31 and a negative electrode 32, are installed on a woven mesh substrate 2 in net form that is woven from a plurality of vertical strands 21 that are insulating and a plurality of horizontal strands 22 that are electrically conductive, and having a mesh 23 in matrix form with a plurality of rows and a plurality of columns.

First, in a first step, after a plurality of vertical strands 21 have been passed over the supply side guide roller 51 and through the guide plate 52, they are divided by the heddle mechanism 53 into the first group of vertical strands 21a including a plurality of the vertical strands 21 that are arranged in parallel with fixed intervals between them, and the second group of vertical strands 21b including a plurality of the vertical strands 21 that are arranged in parallel with the first group of vertical strands 21a and are positioned alternatingly therewith. And the first group of vertical strands 21a and the second group of vertical strands 21b are shifted up and down by the peddle mechanism 53, so as to create gaps between the first group of vertical strands 21a and the second group of vertical strands 21b for the shuttle to pass through.

Next, in a second step, the shuttle member 54a of the shuttle mechanism 54 is passed through the gap between the first and second groups of vertical strands 21a, 21b in the direction orthogonal to the vertical strands 21, so that a horizontal strand 22 is supplied. This one horizontal strand 2 constitutes one conductive connection member 20.

Next, reed pushing is performed in a third step, and the horizontal strand 22 that has been supplied in the second step is pushed to the downstream side by the reed mechanism 54, so that the horizontal strand 22 is regulated into the state of extending orthogonally with respect to the vertical strands 21. At this time, if a plurality of solar cells 3 were supplied at the downstream side in the processing one cycle before, then the horizontal strand 22 is pushed against their positive electrodes 31. In this manner, first, the woven mesh substrate in net form 2 woven from the plurality of vertical strands 21 that are insulating and the plurality of horizontal strands 22 that are electrically conductive is manufactured.

Next, in a fourth step, first conductive junction blobs 4 consisting of silver paste are applied by the application mechanism 56 (i.e. by the first application mechanism 57) at a plurality of sites on the horizontal strand 22 that has been pushed by the reed mechanism in the third step, so as to connect the plurality of solar cells 3 there.

First, in concrete terms, first conductive junction blobs 4 that are supplied by the supply mechanism 64 are picked up at the end portions of the plurality of dispensers 56b that are in their pickup positions. Next, the plurality of dispensers 56b are rotated by about 270° in the anticlockwise direction, so that the plurality of dispensers 56b are changed over to their application positions and the first conductive junction blobs 4 are applied to a plurality of sites on the horizontal strand 22. Thereafter, the plurality of dispensers 56b are rotated by about 270° in the clockwise direction, so that they are returned to their pickup positions.

Next, in a fifth step, a plurality of solar cells 3 are installed by the semiconductor element supply mechanism 59 so as to correspond to the plurality of sites where the first conductive junction blobs 4 were applied in the fourth step, and their plurality of negative electrodes 32 are joined to the first conductive junction blobs 4 at the plurality of sites. The plurality of solar cells 3 that are supplied by this fifth step constitute one element group 3A along the row direction.

In concrete terms, first, the solar cells 3 are supplied to the end portions of the air pincettes 59b which are in their holding positions, and the solar cells 3 are held by the air pincettes 59b due to the negative pressure that is generated at the nozzles 59c. Next, the air pincettes 59b are rotated by about 270° in the clockwise direction, so that the air pincettes 59b are changed over to their loading positions, and the negative electrodes 32 of the solar cells 3a are joined to the horizontal strand 22 to which the first conductive junction blobs 4 have been applied. Thereafter, the plurality of air pincettes 59b are returned to their holding positions by being rotated by about 270° in the anticlockwise direction. At this time, since the semiconductor element supply mechanism 59 pushes the solar cells 3 in the downstream direction after having joined them to the first conductive junction blobs 4, accordingly it is possible to anticipate the same beneficial effect as that provided by the reed mechanism 55.

And, in a sixth step, the woven mesh substrate 2 is pulled outward to the downstream side by the pulling out mechanism 63 by one pitch, which corresponds to the diameter of the solar cells 3. This sixth step is one corresponding to the pulling out step that is performed after the fifth step.

Next, in a seventh step, second conductive junction blobs 5 consisting of silver paste are applied by the application mechanism 56 (i.e. by the second application mechanism 58) to the plurality of positive electrodes 31 of the plurality of solar cells 3 that were installed by the fifth step. This seventh step is one corresponding to the application step.

In concrete terms, first the second conductive junction blobs 5 that are supplied by the supply mechanism 64 are picked up at the end portions of the plurality of dispensers 56b which are in their pickup positions. Next, the plurality of dispensers 56b are rotated in the anticlockwise direction by about 270°, so that the plurality of dispensers 56b are changed over to their application positions, and the second conductive junction blobs 5 are applied to the plurality of positive electrodes 31. Thereafter, the plurality of dispensers 56b are rotated in the clockwise direction by about 270°, so that they are returned to their pickup positions.

During the return shifting of the plurality of dispensers 56b described above, in order to install an amount of the plurality of solar cells 3 corresponding to one pitch to the woven mesh substrate 2 to create the next line of the weave: the first group of vertical strands 21a and the second group of vertical strands 21b are shifted by the heddle mechanism 53 so that they come into the opposite up/down positional relationship from their original up/down positional relationship (the first step) the shuttle member 54a is passed through the gap between the first and second groups of vertical strands 21a, 21b so as to supply a horizontal strand 22 (the second step); and the horizontal strand 22 that has been supplied is pushed by the reed mechanism 55 (the third step). Thereafter the fourth through the fifth steps are executed, and the plurality of conductive junction blobs 4 and the plurality of solar cells 3 are supplied by the application mechanism 56 and the semiconductor element supply mechanism 59.

Next in an eighth step, after the seventh step, the conductive junction blobs 4, 5 in the row direction are irradiated with hot air or infrared radiation or the like by the heat application mechanism 61 that is disposed on the downstream side of the application mechanism 56 and the semiconductor element supply mechanism 59, and the conductive junction blobs 4, 5 are thereby dried, so that these conductive junction blobs 4, 5 are hardened over a short time period. Due to this, it is possible to join together the horizontal strands 22 and the plurality of solar cells 3 solidly, and to connect them together electrically. It would be acceptable to employ any of irradiation with laser light or infrared radiation, irradiation with a condensing lamp, or local blowing of heated air as the method for application of heat. This eighth step is one corresponding to the heat application step.

Next in a ninth step, after the eighth step, while the woven mesh substrate with elements 1 passes through the tunnel shaped passage aperture of the protective layer covering mechanism 62 that is disposed on the downstream side of the heat application mechanism 61, using a spray method, both the upper and lower sides of the woven mesh substrate with attached elements 1 are coated with protective insulating layers 6 that are flexible and optically transparent (i.e. with surface coatings of a silane coupling compound). This ninth step is one corresponding to the covering step.

It is possible to manufacture the woven mesh substrate with elements 1 continuously while covering it with the protective insulating layers 6 by executing the first step through the ninth step described above repeatedly a plurality of times. This step of repetition is one corresponding to the sixth step of claim 1. And finally the woven mesh substrate with elements 1 is stored while being intermittently wound up one pitch at a time by the pulling out mechanism 63.

It should be understood that the first fabric portions 25 may be formed at both end portions in the length direction of the woven mesh substrate with elements 1, and the second fabric portions 26 may be formed at both edge portions in the width direction of the woven mesh substrate with elements 1. Moreover, sets of two mutually continuous first fabric portions 25 may be formed at positions partway along the length direction of the woven mesh substrate with elements 1 that are spaced apart by appropriate distances, and these intermediate positions where the sets of two continuous first fabric portions 25 are provided will become locations at which the woven mesh substrate can be divided into sections.

Next, the advantageous effects of the woven mesh substrate with semiconductor elements 1, of the device 50 for manufacturing it, and of the method for manufacturing it, will be explained.

Since, while weaving the woven mesh substrate 2 from the plurality of vertical strands 21 and the plurality of horizontal strands 22 using the weaving machine shown in FIG. 7 (i.e. the manufacturing device 50), the plurality of solar cells 3 (i.e. spherical semiconductor elements) are installed to the woven mesh substrate 2, and their negative electrodes 32 and positive electrodes 31 are electrically connected to the horizontal strands 22, with the conductive junction blobs 4, 5, accordingly it is possible to automate the manufacture of the woven mesh substrate 2, the installation of the solar cells 3, and the application of the conductive junction blobs 4, 5, and it is possible to manufacture a woven mesh substrate with elements 1 having a stable product quality efficiently with a small number of steps, and it is also possible to reduce the manufacturing cost of this woven mesh substrate with elements 1.

Since it is sufficient additionally to fit the application mechanism 56 (i.e. the first and second application mechanisms 57, 58), the semiconductor element supply mechanism 59, the heat application mechanism 61, the protective layer covering mechanism 62 and so on, while effectively utilizing the supply side guide roller 51, the heddle mechanism 53, the reed mechanism 55, and the pulling out mechanism 63 of an already existing weaving machine, accordingly this is advantageous from the aspects of the design, the manufacture, and the manufacturing cost of the manufacturing device 50 for the woven mesh substrate with elements 1, and it is possible to provide the manufacturing device 50 that can automatically manufacture the woven mesh substrate with elements 1.

Since, according to this woven mesh substrate with elements 1, along with the plurality of solar cells 3 in this woven mesh substrate with elements 1 being grouped into a plurality of groups with row direction element groups 3A each of which consists of a plurality of the solar cells 3 arranged along the horizontal direction being an unit thereof, and the plurality of row direction element groups 3A being arranged in a plurality of rows, also the conductive connection members 20 each of which consists of a single horizontal strand 22 are provided between adjacent ones of the row direction element groups 3A, so that the plurality of solar cells 3 in each row direction element group 3A are electrically connected in parallel via their pair of conductive connection members 20, and moreover the plurality of row direction element groups 3A are connected in series via the plurality of conductive connection members 20, accordingly, in the case of a woven mesh substrate with elements 1 for receiving light, it is possible to set the voltage that is generated freely according to the number of elements that are connected in series, and it is also possible to set the current that is generated freely according to the number of elements that are connected in parallel.

And, since the plurality of solar cells 3 are connected in series in the vertical direction and are connected in parallel in the horizontal direction, accordingly, even if a portion may occur over which the woven mesh substrate with elements 1 for light reception becomes partially shaded, still it is possible to suppress to the minimum limit the influence thereof on the output of the solar cells 3 in the other portion that is not shaded. Moreover, it is possible for this woven mesh substrate with elements 1 to receive light or to emit light with equal efficiency from both its sides, i.e. either from its upper surface or from its lower surface.

Furthermore, this woven mesh substrate with elements 1 can be employed as a woven mesh substrate with elements 1 that is flexible, light in weight, thin, bendable, see through, and translucent to daylight, and that has a light reception function. And, since this woven mesh substrate with elements 1 is manufactured by being woven in net form, accordingly it can be finished as a product of various types, according to its application as an intermediate product. With regard to the series connection structure of this woven mesh substrate with attached elements 1, since it is not necessary to provide any separate conducting lines far series connection, and since the number of components can be reduced and it is not necessary to provide any gaps between the row direction element groups 3A, accordingly it is possible to arrange the solar cells 3 more tightly together, and thus it is possible to enhance the light reception efficiency or the light emission efficiency.

Embodiment 2

While, in this embodiment, there are described a woven mesh substrate with semiconductor elements 1A in which the woven mesh substrate with semiconductor elements 1 of the above Embodiment #1 is partially altered, and a manufacturing device 50A for manufacturing this woven mesh substrate with semiconductor elements 1A in which the manufacturing device 50 described above is partially altered and a manufacturing method for the woven mesh substrate with semiconductor elements 1A, to constitutional elements that are similar to elements of the first embodiment the same reference numerals will be appended, and explanation thereof will be omitted, with only those elements that are different being explained.

Figure 9:
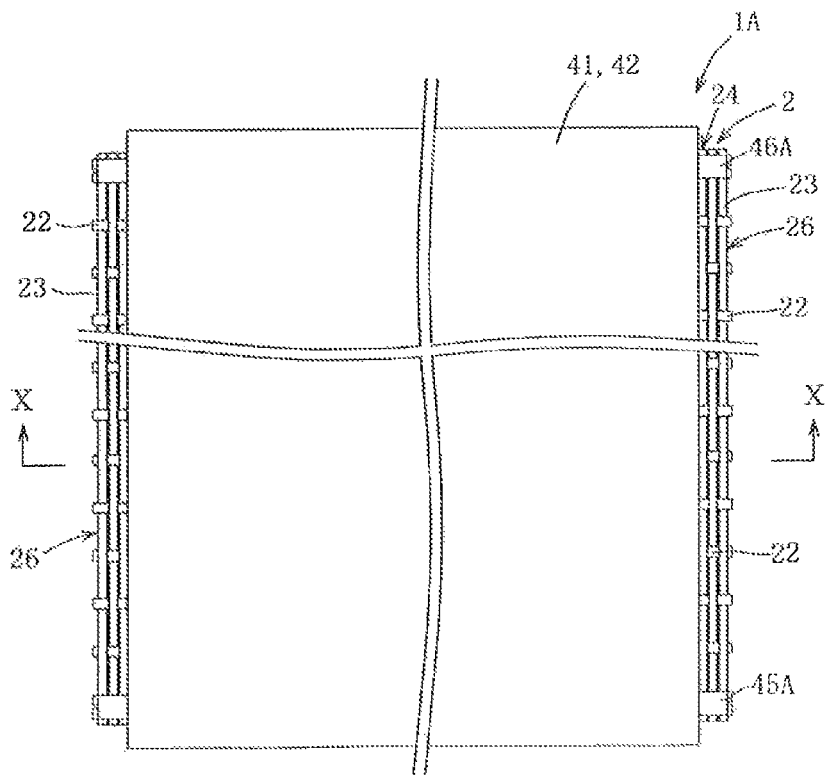
FIG. 9 is a plan view of a woven mesh substrate with semiconductor elements according to a second embodiment of the present invention.
Figure 10:
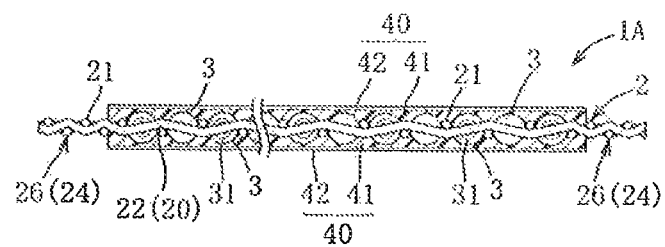
FIG. 10 is a sectional view taken along lines X-X of FIG. 9.

First, the woven mesh substrate with semiconductor elements 1A will be explained. As shown in FIGS. 9 and 10, the woven mesh substrate with attached semiconductor elements 1A (hereinafter "woven mesh substrate with elements 1A") is a device that produces a similar woven mesh substrate with elements 1 to that of the first embodiment, this substrate being flexible and optically transparent and including a woven mesh substrate 2 and a plurality of solar cells 3, and being sealed in an embedded state between a pair of upper and lower sheets 40 that are made from a resin material. It should be understood that detailed explanations of the woven mesh substrate 2, of the plurality of solar cells 3, and of the series parallel structure for the plurality of solar cells 3 are omitted, since these are the same as in the first embodiment.

In concrete terms, in the woven mesh substrate with elements 1A, the upper and lower sides of the woven mesh substrate and the plurality of solar cells 3 are not surface coated with any protective insulating layers 6 (surface layers of silane coupling compound or layers of parylene) such as those of the first embodiment, but rather both the upper and lower sides are formed as flat surfaces by being sandwiched between synthetic resin material sheets 40 that are optically transparent and flexible, and by pressurization and heat then being applied. The synthetic resin material sheets 40 are see through material sheets that are flexible, and each is made by forming a synthetic resin film layer 42 of PET resin film or the like on one side of an EVA sheet 41 (or a PVB sheet or the like).

With this woven mesh substrate with elements 1A, since the synthetic resin film layer 42 made from PET (polyethylene terephthalate) resin film or PVF (polyvinyl fluoride resin) or the like is provided on both the upper and lower sides of the EVA sheets 41 within which the woven mesh substrate 2 and the plurality of solar cells 3 are sealed in an embedded manner, accordingly the light in the incident light, other than that which is directly absorbed by the surfaces of the solar cells 3, is finally absorbed by the surfaces of the solar cells 3, after being repeatedly multiply reflected by the inner surface of the synthetic resin film layer 42, by the solar cells 3, and by the surfaces of the vertical strands 21 and of the horizontal strands 22. Due to this, it is possible to anticipate enhancement of the overall output of the woven mesh substrate with elements 1A.

In order to make it easy to establish electrical or mechanical connection of the woven mesh substrate with elements 1A to the exterior, integrated external terminals 45A, 46A are made by coupling together the plurality of horizontal strands 22 at both the left, and right end portions of the lower side first fabric portions 25 with solder or silver paste, and by coupling together the plurality of horizontal strands 22 at both the left and right end portions of the upper side first fabric portions 25 with solder or silver paste. By taking advantage of these, it is possible to connect the required number of pieces of the woven mesh substrate with elements 1A in parallel and/or in series, and thus to manufacture a woven mesh substrate with elements 1A having a higher output of electrical power. With this woven mesh substrate with elements 1A, since the plurality of solar cells 3 are installed in the meshes 23 that are surrounded by the vertical strands 21 and the horizontal strands 22 and that have the same structure as the fabric, and are electrically and mechanically connected thereto, accordingly it is possible for the necessary number of components to be reduced, and it is possible to keep down the amount of material used and the manufacturing cost. For this, it is desirable for the woven mesh substrate sheet 1A to be thin and light, and to have a see through and flexible structure.

Next, the manufacturing device 50A for manufacturing the woven mesh substrate with elements 1A will be explained.

Figure 11:
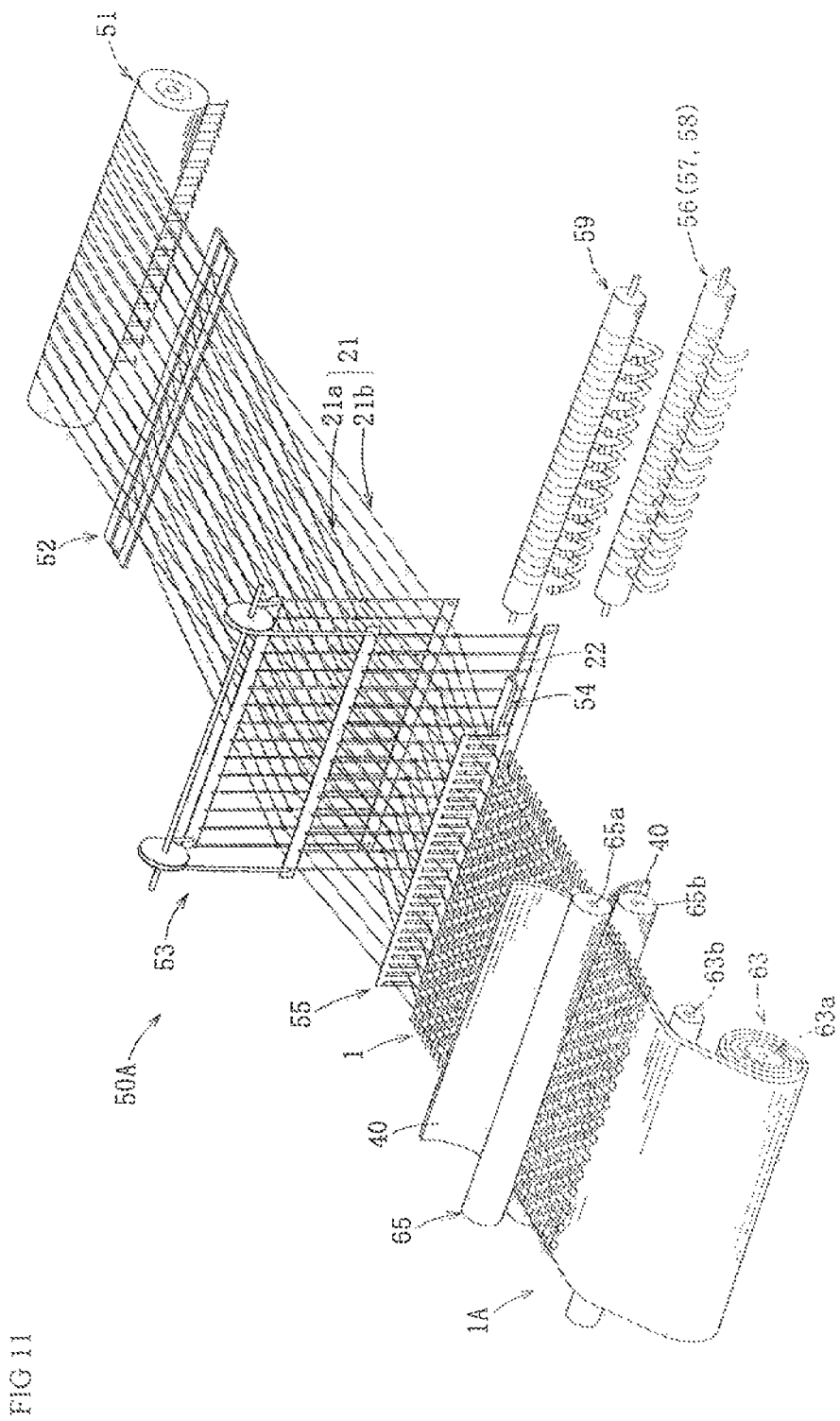
FIG. 11 is a perspective view of a device for manufacturing a woven mesh substrate with semiconductor elements.
Figure 12:
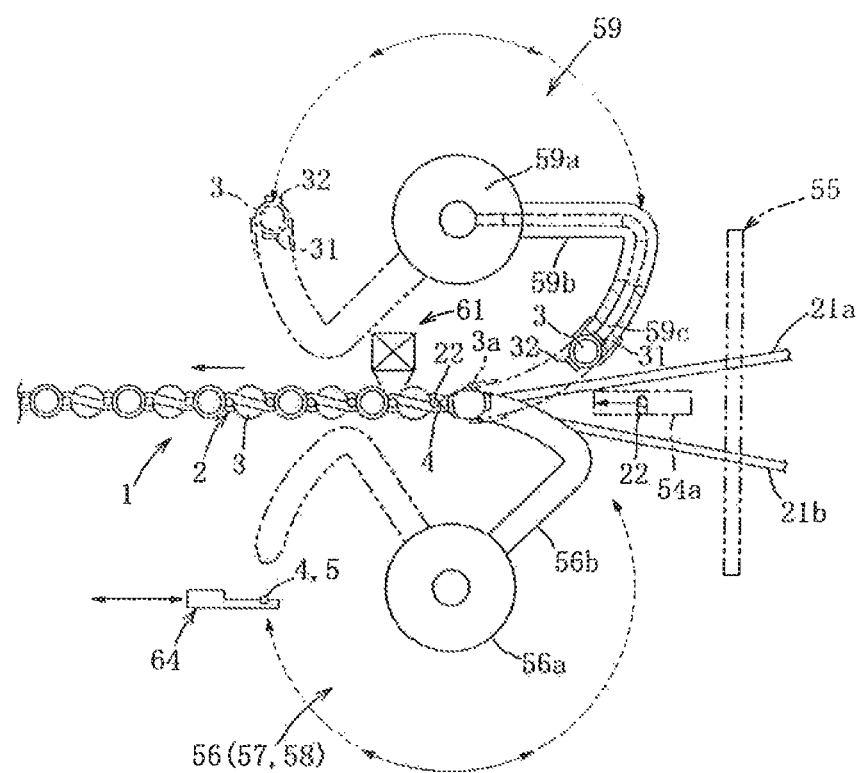
FIG. 12 is an enlarged sectional view of essential portions of an application mechanism and a semiconductor element supply mechanism of the device for manufacturing a woven mesh substrate with semiconductor elements.

As shown in FIGS. 11 and 12, the manufacturing device 50A comprises, from the upstream side to the downstream side, a supply side guide roller 51, a guide plate 52, a heddle mechanism 53, a shuttle mechanism 54, a reed mechanism 55, an application mechanism 56 that is a combined first application mechanism 57 and second application mechanism 58, a semiconductor element supply mechanism 59, a heat application mechanism 61, a heat application and pressurization mechanism 65, and a pulling out mechanism 63; but, since this manufacturing device 50A is the same as the first embodiment described above apart from the protective layer covering mechanism 62 from the first embodiment being omitted and the heat application and pressurization mechanism 65 being added, accordingly the same reference symbols will be appended to constitutional elements that are the same as in the above described first embodiment, and description thereof will be omitted, with only the heat application and pressurization mechanism 65 being explained.

As shown in FIG. 11, the heat application and pressurization mechanism 65 comprises a pair of upper and lower roller members 65a, 65b that are capable of forwarding synthetic resin material sheets 40 that are supplied both from above and from below the woven mesh substrate 2 and the plurality of solar cells 3 while pressurizing and applying heat thereto, and is disposed on the downstream side of the heat application mechanism 61 (not shown). Thus, the heat application and pressurization mechanism 65 is a device that forms the woven mesh substrate with elements 1A by layering the flexible and optically transparent synthetic resin material sheets 40 from both above and below against the woven mesh substrate 2 and against the plurality of solar cells 3 that have been installed to this woven mesh substrate 2, and applying heat and pressure thereto.

Next, the method for manufacturing the woven mesh substrate with elements 1A will be explained.

Since the first step through the eighth step are the same as in the first embodiment, explanation thereof will be omitted, and in a step after the eighth step, instead of the ninth step of the first embodiment, the synthetic resin material sheets 40 (for example, ones in which a synthetic resin film layer 42 has been adhered to the surface of an EVA resin sheet 41) that are flexible and optically transparent are laid by the heat application and pressurization mechanism 65 against both the upper and lower sides of the woven mesh substrate with elements and the EVA resin is softened and melted by heat and pressurization being applied by the pair of roller members 65a, 65b, and thus a woven mesh substrate with elements 1A is manufactured in which the woven mesh substrate 2 and the plurality of solar cells 3 are sealed within the EVA resin in an embedded manner. Finally, the woven mesh substrate with elements 1A is stored while being intermittently wound up on the winding up roller 63a of the pulling out mechanism 63. This step is one corresponding to the overlaying step in claim 6. Since the other structures, operation, and beneficial effects are the same as in the case of the first embodiment described above, explanation thereof will be omitted.

Embodiment 3

While, in this embodiment, a manufacturing device 50B is described in which the manufacturing devices 50, 50A described above for manufacturing the woven mesh substrates with elements 1, 1A are partially altered, to constitutional elements that are similar to elements of the first and second embodiments the same reference numerals will be appended, and explanation thereof will be omitted, with only those elements that are different being explained. It should be understood that while, with the manufacturing devices 50, 50A of the first and second embodiments described above, the woven mesh substrates with elements 1, 1A were woven while being pulled out in the horizontal direction, with the manufacturing device 50B of this embodiment, the woven mesh substrate with elements 1, 1A is woven while being pulled out downwards.

First, the manufacturing device 50B will be explained.

Figure 13:
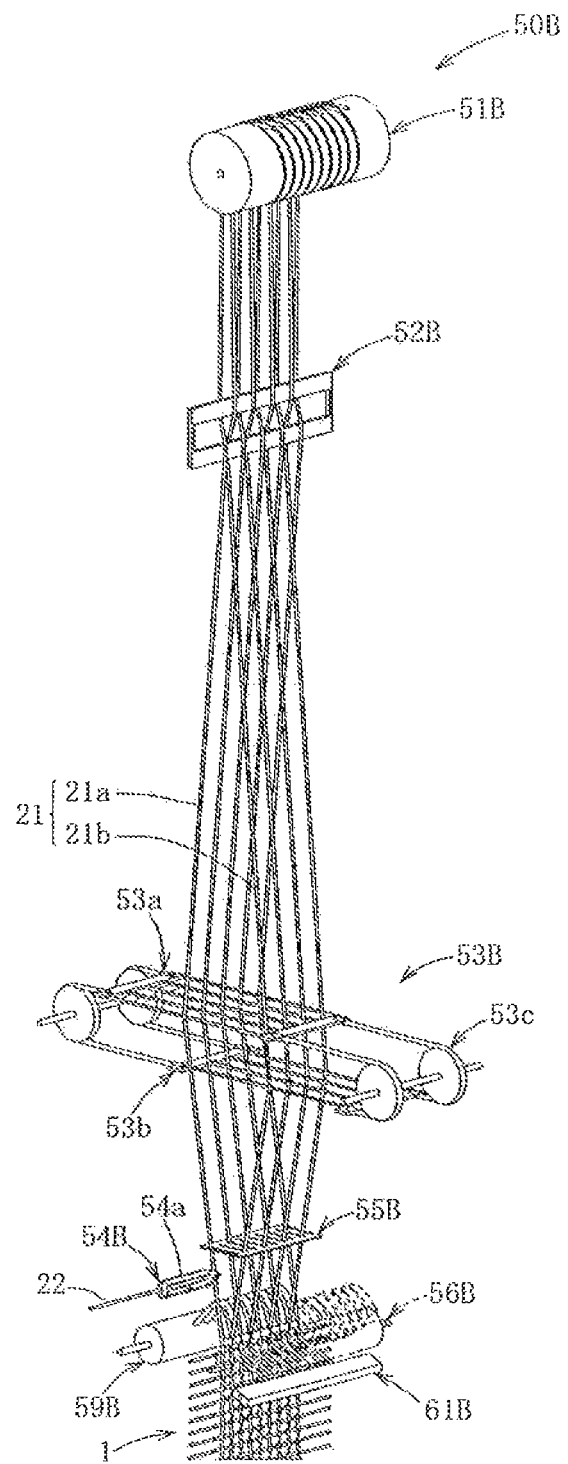
FIG. 13 is a perspective view of a device for manufacturing a woven substrate according to a third embodiment of the present invention.
Figure 14:
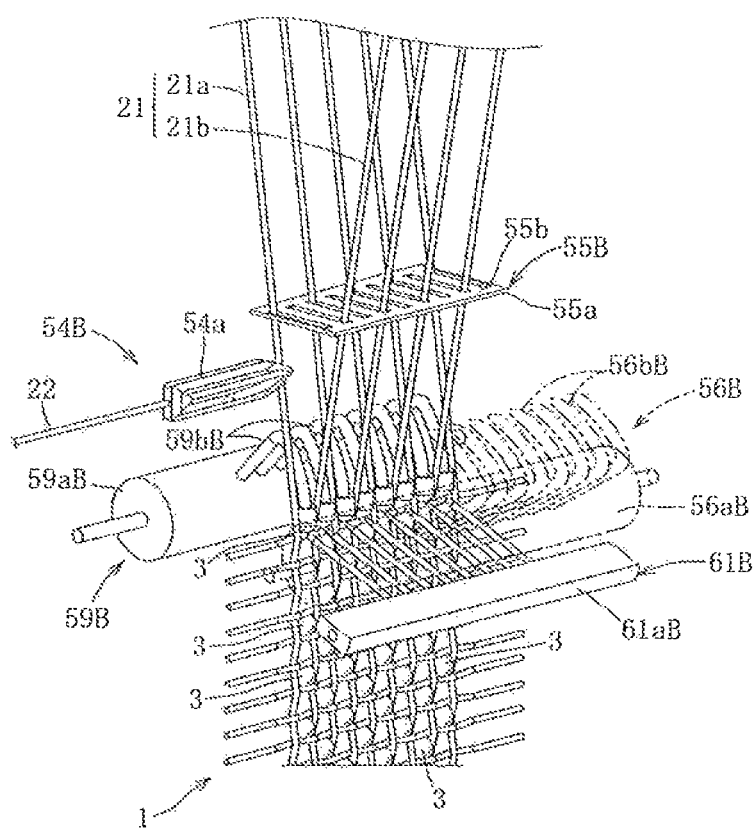
FIG. 14 is an enlarged perspective view of essential portions of the device for manufacturing a woven mesh substrate.

As shown in FIGS. 13 and 14, the manufacturing device 50B is substantially the manufacturing device 50, 50A of the first or second embodiment but erected in a vertical attitude, and comprises, from the upstream side (the higher side) to the downstream side (the lower side), a supply side guide roller 51B, a guide plate 52B, a heddle mechanism 53B, a shuttle mechanism 54B, a reed mechanism 55B, an application mechanism 56B, a semiconductor element supply mechanism 59B, a heat application mechanism 61B, and a pulling out mechanism (not shown).

The supply side guide roller 51B, the guide plate 52B, the heddle mechanism 53B, the shuttle mechanism 54B, and the reed mechanism 55B are the same as those of the first embodiment described above, apart from the fact that they are disposed in a vertical orientation. Moreover, it would be acceptable to store the portion of the woven mesh substrate with elements 1 that is more downstream than the heat application mechanism 61B by winding it up on the pulling out mechanism, while keeping it in the vertical attitude; or, alternatively, it would be acceptable to wind it up on the pulling out mechanism, after having converted its direction so that it extends in a horizontal attitude. It should be understood that only a portion of the structure of the manufacturing device 50B is shown in FIGS. 13 and 14, and actually the number of the vertical strands 21 is several tens to several hundreds.

Next, the application mechanism 56B will be explained.

As shown in FIGS. 13 through 16 the application mechanism 56B is a device that applies conductive junction blobs 49 at a plurality of locations on the horizontal strands 22 (i.e. the conductive connection members 20) that have been pushed by the reed corresponding to a portion of the meshes 23 in net form, or corresponding to all thereof. The application mechanism 56B is disposed more downstream than the reed mechanism 55B and on the right side of the woven mesh substrate 2 that has been woven from the plurality of vertical strands 21 and the plurality of horizontal strands 22 (refer to FIGS. 15 and 16). It should be understood that the conductive junction blobs 49 for connecting the positive electrodes 31 of the solar cells 3 to the horizontal strands 22 are ones that correspond to the "second conductive junction blobs 5", while the conductive junction blobs 49 for connecting the negative electrodes 32 of the solar cells 3 to the horizontal strands 22 are ones that correspond to the "first conductive junction blobs 4".

The application mechanism 56B comprises a first rotation drum 56aB that can be rotationally driven by just a predetermined angle (around 180°) and a plurality of L shaped dispensers 56bB that are fixed to the outer circumferential surface of the first rotation drum 56aB with fixed intervals between them along the axial direction. The plurality of dispensers 56bB are fixed so as to correspond to all of the meshes 23. It should be understood that it would also be acceptable for the plurality of dispensers 56bB to be provided on the outer circumferential surface of the first rotation drum 56aB, so as to correspond to only a portion of the meshes 23 (for example, to alternate ones of the meshes 23). Moreover, according to requirements, it would also be acceptable to provide a shift drive mechanism (not shown) for shifting the first rotation drum 56aB of the application mechanism 56B by a predetermined distance in its axial direction.

The first rotation drum 56aB is rotatably supported on a machine frame of the manufacturing device 50B, not shown in the figures, and is reciprocally rotationally driven to and fro by a drum rotation drive mechanism (not shown). This first rotation drum 56aB can be changed over between a pickup position in which it picks up conductive junction blobs from the supply mechanism 64B (refer to the double dotted chain line in FIG. 16), and an application position in which it is rotated from the pickup position in the anticlockwise direction through, for example, about 180°, and applies these blobs from above to a horizontal strand 22 (the solid line position in FIG. 15). The supply mechanism 64B is capable of supplying a plurality of the conductive junction blobs 49 via a plurality of supply passages formed in its interior, and can selectively supply these blobs at the end portions of the plurality of dispensers 56bB.

Figure 15:
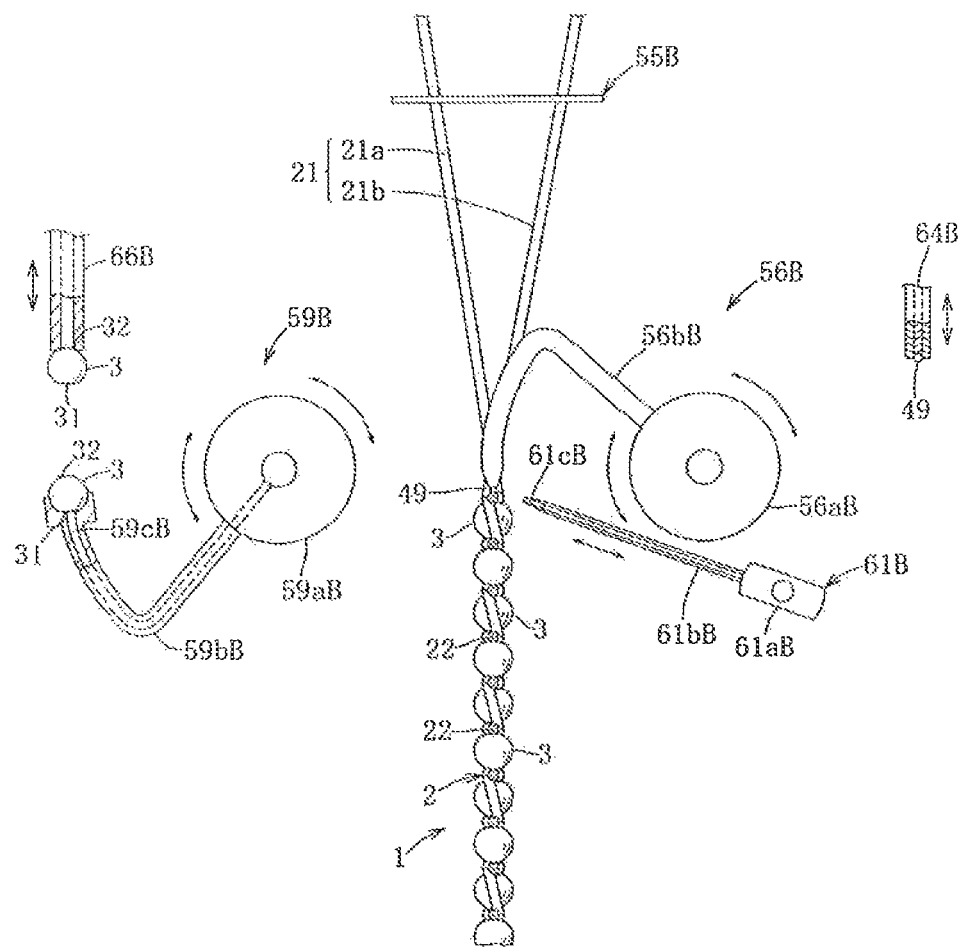
FIG. 15 is an enlarged sectional view of essential portions of an application mechanism and a semiconductor element supply mechanism of the device for manufacturing a woven mesh substrate with semiconductor elements.
Figure 16:
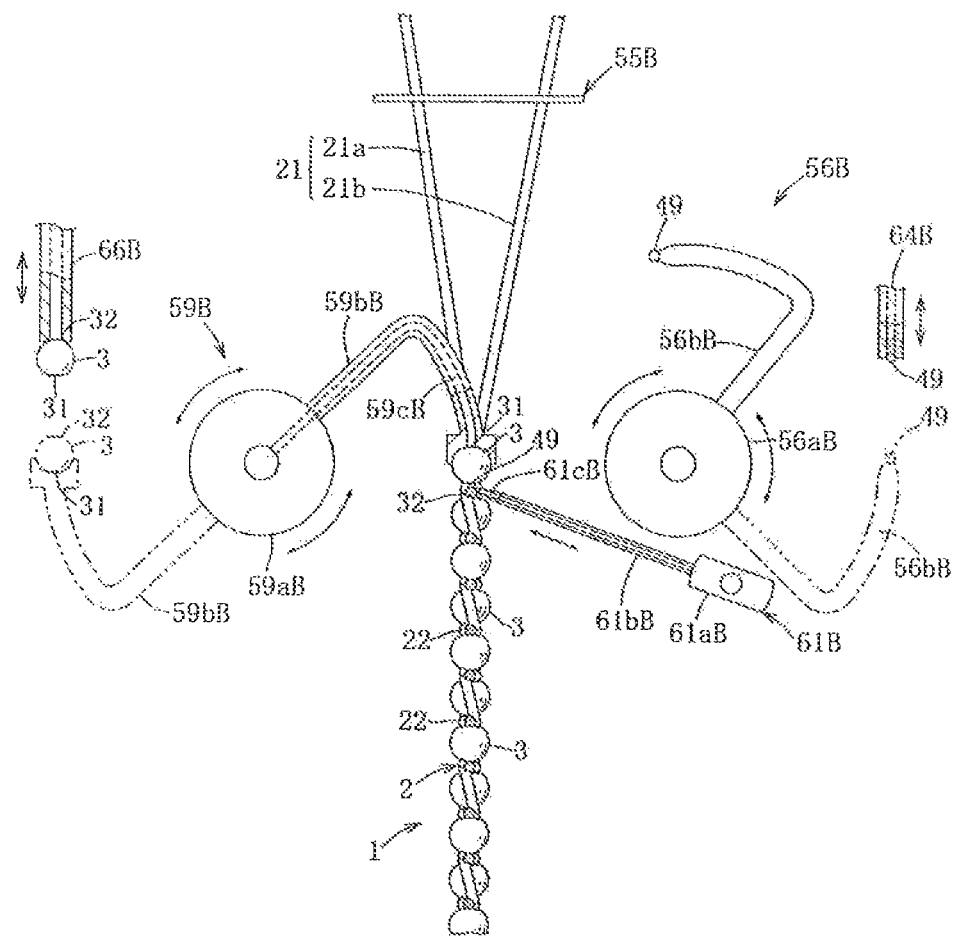
FIG. 16 is an enlarged sectional view of essential portions of an application mechanism and a semiconductor element supply mechanism of the device for manufacturing a woven mesh substrate with semiconductor elements.

As shown in FIGS. 15 and 16, each of the dispensers 56bB is formed in an L shape. Each of the dispensers 56bB is built so as to be capable of picking up a conductive junction blob 49 at its end portion and distributing it. When the plurality of dispensers 56bB are to pick up conductive junction blobs 49, in the state in which the dispensers 56bB are in their pickup positions with the end portions of the dispensers 56bB being oriented so as to point upward, conductive junction blobs 49 are supplied by the supply mechanism 64B that is capable of sliding in the direction of the arrow sign, and, by this supply mechanism 64B shifting downwards, the conductive junction blobs 49 are picked up at the end portions of the plurality of dispensers 56bB. It should be understood that it would also be acceptable to employ a structure in which the conductive junction blobs are distributed by air at negative pressure, i.e. in which the dispensers 56bB pick up the conductive junction blobs 49 with negative pressure.

Next, the semiconductor element supply mechanism 5913 will be explained. As shown in FIGS. 15 and 16, the semiconductor element supply mechanism 5913 is a mechanism that, having installed a plurality of solar cells 3 so that they correspond to all or some of the plurality of sites at which the conductive junction blobs 49 have been applied, connects their plurality of positive electrodes 31 (i.e. second electrodes) or their plurality of negative electrodes 32 (i.e., first electrodes) to the horizontal strands 22. The semiconductor element supply mechanism 5913 is disposed more downstream than the reed mechanism 55B, and on the left side of the woven mesh substrate 2 (refer to FIGS. 15 and 16).

The semiconductor element supply mechanism 59B comprises a second rotation drum 59aB that can be driven by a predetermined rotational angle (around 180°) and to the interior of which negative pressure is supplied, and a plurality of air pincettes 59bB formed in L shapes that are fixed to the outer circumferential surface of the second rotation drum 59aB at predetermined intervals in its axial direction. The plurality of air pincettes 59bB are fixed to the outer circumferential surface of the second rotation drum 59aB, so as to correspond to all of the meshes 23. It should be understood that it would also be acceptable for the plurality of air pincettes 59bB to be provided on the outer circumferential surface of the second rotation drum 59aB so as to correspond to a portion of the meshes 23 (for example to alternate ones of the meshes 23). Furthermore, according to requirements, it would also be acceptable to provide a shift drive mechanism (not shown) for shifting the second rotation drum 59aB of the semiconductor element supply mechanism 59B by a predetermined distance in its axial direction.

The second rotation drum 59aB is supported on the frame (not shown) of the manufacturing device 50B so that it can be rotationally driven, and is reciprocatingly rotationally driven to and fro by a reciprocating rotation drive mechanism (not shown). Air at negative pressure can be introduced into the interior of the second rotation drum 59a by a negative pressure generation mechanism (not shown). This second rotation drum 59aB can be changed over to a holding position (shown in FIG. 15 by the solid lines) in which it receives and holds a solar cell 3 from a supply mechanism 66B, and to a loading position (shown by the solid lines in FIG. 16) in which it is rotated by, for example, around 180° in the clockwise direction from this holding position, and in which it joins the solar cell 3 to one of the conductive junction blobs 49 from above. The supply mechanism 66B is capable of supporting a plurality of the solar cells 3 at its end portion by negative pressure, and can selectively supply them to the end portions of the plurality of air pincettes 59bB.

As shown in FIGS. 15 and 16, each of the air pincettes 59bB is made from an L shaped pipe member. Nozzles 59cB are formed at the end portions of the air pincettes 59b, and these are connected to the interior of the second rotation drum 59aB via negative pressure introducing passages. When the solar cells 3 are to be held by the air pincettes 59bB, the solar cells 3 are supplied to the end portions of the air pincettes 59bB after having been positioned by the supply mechanism 66B into a predetermined attitude (i.e., their negative electrodes 32 are on top and their positive electrodes 31 are underneath); and, since negative pressure is generated at the nozzles 59cB at the end portions of the air pincettes 69b when negative pressure is introduced into the interior of the second rotation drum 59aB, accordingly their end portions pick up and hold the positive electrode 31 sides of the solar cells 3 due to the negative pressure.

Next, the heat application mechanism 61B will be explained.

As shown in FIGS. 13 through 16, the heat application mechanism 61B is disposed below the application mechanism 56B. The heat application mechanism 61B comprises a main body member 61aB that can be driven to approach towards the junction portions between the plurality of solar cells 3 and the horizontal strands 22 and to recede therefrom, and a plurality of hot air supply portions 61bB that are shaped as generally rectilinear and are attached to the main body member 61aB at fixed intervals. The plurality of hot air supply portions 61bB are fixed to an external peripheral portion of the main body member 61aB, so as to correspond to all of the meshes 23; it should be understood that the number of the plurality of hot air supply portions 61bB need not necessarily correspond to all of the meshes 23; it would also be acceptable for the number thereof to correspond to only some of the meshes 23. Moreover, according to requirements, it would also be acceptable to provide a shift drive mechanism (not shown) to the heat application mechanism 61B, in order to shift the main body member 61aB by a predetermined distance in its longitudinal direction.

Nozzles 61cB that communicate with the interior of the main body member 61aB are formed at the end portions of the hot air supply portions 61bB. This heat application mechanism 61B is a device for, after the plurality of solar cells 3 have been installed to the woven mesh substrate 2, hardening in a short period of time the conductive junction blobs 49 at the junction portions between the plurality of solar cells 3 and the horizontal strands 22 (i.e. the conductive connection members 20). In concrete terms, the nozzles 61cB at the end portions of the plurality of hot air supply portions 61bB of the heat application mechanism 61B are approached to the junction portions, and hot air locally blown out from the plurality of nozzles 61cB, so that heat is applied to the conductive junction blobs 49 and they are dried and hardened. It would also be acceptable for the heat application mechanism 61B to be adapted to be capable of blowing out hot air selectively from only some of the plurality of nozzles 61cB.

Although this feature is omitted from the figure, it should also be understood that it would be possible to provide, on the downstream side of the heat application mechanism 61B a protective layer covering mechanism 62 for covering both the upper and lower sides of the woven mesh substrate with elements 1 with flexible and optically transparent protective insulating layers 6 (i.e. surface coatings of a silane coupling compound); or, it would also be possible to provide a heat application and pressurization mechanism 65, so as to produce a woven mesh substrate with elements 1A by layering sheets 40 of a flexible and optically transparent synthetic resin against both sides of the woven mesh substrate with elements 1, and by then applying heat and pressure thereto.

Next the manufacturing method for the woven mesh substrate with elements 1 executed by this manufacturing device 50B will be explained; but, for the first step through the third step, all the features are the same as in the case of the first embodiment apart from the facts that the heddle mechanism 53B, the shuttle mechanism 54B, and the reed mechanism 55B are arranged in a vertical orientation and that the first step through the third step are executed vertically, and accordingly explanation thereof will be omitted, and only the fourth and subsequent steps will be explained.

First, in a fourth step, conductive junction blobs 49 made from silver paste are applied by the application mechanism 56B at the plurality of sites on the horizontal strand 22 that has been pushed by the reed in the third step corresponding to all of the meshes 23 of the net. This fourth step corresponds to the fourth step of claim 1.

In concrete terms, first, conductive junction blobs 49 supplied by the supply mechanism 64B are picked up at the end portions of the plurality of dispensers 56bB that are in their pickup positions, and next, the plurality of dispensers 56bB are rotated by around 180° in the anticlockwise direction, so that the plurality of dispensers 56bB are changed over to their application positions, and the conductive junction blobs 49 are applied from above to the plurality of sites on the horizontal strand 22 corresponding to all of the meshes 23.

Thereafter, the plurality of dispensers 56bB are rotated by around 180° in the clockwise direction, so that they are returned to their pickup positions, and the next set of conductive junction blobs 49 are supplied by the supply mechanism 64B, and are picked up at the end portions of the dispensers 56bB. It should be understood that it would also be possible to apply conductive junction blobs 49 selectively with the application mechanism 56B, to a plurality of sites that correspond to only a portion of the meshes 23 of the net. In this case, the conductive junction blobs 49 would be supplied only to the end portions of the corresponding ones of the dispensers 56bB.

It should be understood that, when the plurality of solar cells 3 of the row direction element group 3A adjacent on the downstream side were being installed to the woven mesh substrate 2 in the fifth step one cycle before this one, in other words in the previous fifth step when the weaving of one pitch to the downstream side was being performed, along with conductive junction blobs 49 being applied by the application mechanism 56B at a plurality of sites corresponding to all of the meshes 23 of the horizontal strand 22, they were also applied to the positive electrodes 31 of the plurality of solar cells 3 that were installed by the previous fifth step.

Next, in a fifth step, after a plurality of solar cells 3 have been installed by the semiconductor element supply mechanism 59B to correspond to a portion among the plurality of sites at which the conductive junction blobs 49 were applied in the fourth step (in this embodiment, to alternate ones of the meshes 23 in the left to right direction), each of the plurality of negative electrodes 32 thereof is connected to the horizontal strand 22. This fifth step corresponds to the fifth step of claim 1.

In concrete terms, first, the solar cells 3 are supplied to the end portions of the air pincettes 59bB that are at their holding positions, and the solar cells 3 are held by the air pincettes 59bB due to negative pressure generated at the nozzles 59cB. At this time, the plurality of solar cells 3 are only supplied to the end portions of the appropriate ones of the air pincettes 59bB. And next, the air pincettes 59bB are rotated in the clockwise direction by approximately 180°, so that the air pincettes 59bB are changed over to their loading positions, and the negative electrodes 32 of the solar cells 3 are pressed from above against the horizontal strand 22 to which the conductive junction blobs 49 have previously been applied, and are thereby joined thereto. Thereafter, the plurality of air pincettes 59bB are kept in the state in which they are pressing the negative electrodes 32 of the solar cells 3 against the horizontal strand 22.

In the fifth step, a plurality of the solar cells 3 are installed to each alternate one along the left to right direction of the meshes 23 of the woven mesh substrate 2, and in the subsequent execution of the fifth step, in order to weave the next pitch, a plurality of the solar cells 3 are installed to each alternate one of the meshes 23 of the woven mesh substrate 2 while shifting the alternation one pitch along the left to right direction, and, by repeatedly doing this, the plurality of solar cells are installed to alternate ones of the meshes 23 in the up and down direction; but this is not to be considered as being particularly limitative of the pattern of arrangement for the plurality of solar cells 3.

Next, in a sixth step, the plurality of nozzles 61cB of the heat application mechanism 61B are approached to the junction portions, and hot air is blown against all of the conductive junction blobs 49, so that heat is locally applied to the conductive junction blobs 49 and they are dried, and the plurality of conductive junction blobs 49 are hardened in a short period of time. By doing this, it is possible solidly to connect together electrically the horizontal strand 22 and the negative electrodes 32 of the plurality of solar cells 3. At this time if a plurality of solar cells 3 of the row direction element group 3A one pitch to the downstream side are installed, then it is possible solidly to join together and electrically connect the horizontal strand 22 and the positive electrodes 31 (i.e. the second electrodes) of the plurality of solar cells 3 that are adjacent one pitch to the downstream side by hardening the conductive junction blobs 49. This sixth step corresponds to the heat application step.

Thereafter, since the plurality of solar cells 3 are now solidly joined to the horizontal strand 22, the holding of the plurality of solar cells 3 by the plurality of air pincettes 59bB is released, the plurality of air pincettes 59bB are rotated by 180° in the anticlockwise direction and thus are returned to their holding positions, the next plurality of solar cells 3 are supplied by the supply mechanism 66B, and the plurality of solar cells 3 are held at the end portions of the plurality of air pincettes 59bB.

Next, in a seventh step, the woven mesh substrate with elements 1 is pulled out downwards by a pulling out mechanism (not shown) by one pitch, which corresponds to the diameter of the solar cells 3. And, finally, it will be acceptable for the downstream side portion of the woven mesh substrate with elements 1 to be stored by being wound up in cooperation with the above seventh step, i.e. while being intermittently pulled out by the amount of one pitch by the pulling out mechanism; but the method for storing the woven mesh substrate with attached elements 1 is not to be considered as being particularly limited. This seventh step corresponds to the pulling out step.

It will be acceptable, in a similar manner to the case in the first embodiment, after the above described seventh step, to provide a covering step of covering both sides of the woven mesh substrate with elements 1 with protective insulating layers 6 that are flexible and optically transparent, for example surface layers of a silane coupling compound (this corresponds to the covering step), or, in a similar manner to the case in the second embodiment, to provide a step of overlaying both sides of the woven mesh substrate with elements 1 with sheets 40 of a synthetic resin material that is flexible and optically transparent, and, by applying heat and pressure, to form a woven mesh substrate with semiconductor elements 1A (this corresponds to the overlaying step).

It is possible to manufacture the woven mesh substrate with elements 1 continuously by repeatedly executing the first step through the seventh step described above a plurality of times. This step of repetition corresponds to the sixth step of claim 1.

Furthermore it would also be acceptable, in a similar manner to the case with the first and second embodiments above, to form first fabric portions 25 at both end portions of the woven mesh substrate with elements 1 in the length direction; it would also be acceptable to form second fabric portions 26 at both end portions of the woven mesh substrate with attached elements 1 in the width direction; and it would also be acceptable to form pairs of two such first fabric portions 25 successively at repeated positions spaced apart by an appropriate distance, at intermediate portions along the length direction of the woven mesh substrate with elements 1. These intermediate portions at which these successive pairs of first fabric portions 25 are formed would become sites at which the woven mesh substrate could be divided into sections.

Since, while weaving the woven mesh substrate 2 from the plurality of vertical strands 21 and the plurality of horizontal strands 22 using the weaving machine shown in FIGS. 13 through 16 (i.e. the manufacturing device 50B), the plurality of solar cells 3 are installed to the woven mesh substrate 2, and their negative electrodes 32 and positive electrodes 31 are electrically connected with the conductive junction blobs 49 to the horizontal strands 22 (i.e. to the conductive connection members 20), accordingly it is possible to automate the manufacture of the woven mesh substrate 2, the installation of the solar cells 3, and the application of the conductive junction blobs 49, so that it is possible to manufacture a woven mesh substrate with elements 1 of stabilized product quality efficiently with a small number of processes, and it is also possible to reduce the manufacturing cost of the woven mesh substrate with semiconductor elements 1.

Furthermore, in the method of manufacturing the woven mesh substrate with elements 1 of this embodiment, as compared with the first and second embodiments, since the manufacturing device 50B is installed in a vertical orientation, and the woven mesh substrate with elements 1 is manufactured while being pulled out downwards in a vertical attitude, accordingly it is possible simply and easily to prevent the solar cells 3 or the conductive junction blobs 49 from being separated and falling off from the woven mesh substrate 2, and it is possible to facilitate the installation of the plurality of solar cells 3 to the woven mesh substrate 2.

Yet further, since it is possible to adhere the plurality of solar cells 3 of a row direction element group 3A and the plurality of solar cells 3 of the row direction element group 3A that is adjacent thereto and below at the same time with only a single application of conductive junction blobs 49 to the horizontal strand 22 once, accordingly it is possible to reduce the number of times of application of conductive junction blobs 49 from twice to once as compared with the first and second embodiments described above, so that it is possible to enhance the speed of manufacturing. Moreover, by installing the manufacturing device 50B in a vertical orientation, it is possible to anticipate that an economy of space will result. The other structures, operation, and beneficial effects are omitted, since they are the same as in Embodiments #1 and #2.

Embodiment 4

While, in this embodiment, a woven mesh substrate with semiconductor elements 1C in which the woven mesh substrates with elements 1, 1A of the first through the third embodiments above are partially altered and a manufacturing method for manufacturing this woven mesh substrate with semiconductor elements 1C are explained, to constitutional elements that are similar to ones of the above first through third embodiments similar reference numerals will be appended, and description thereof will be omitted, with only those constitutional elements that are different being explained.

First, the woven mesh substrate with attached semiconductor elements 1C will be explained. As shown in FIGS. 17 through 20, the woven mesh substrate with semiconductor elements 1C ("woven mesh substrate with elements 1C") is woven from a plurality of vertical strands 21 that are insulating and a plurality of horizontal strands 22 that are electrically conductive, and comprises a woven mesh substrate 2C in net form that has meshes 23 arranged in the form of a matrix having a plurality of rows and a plurality of columns, a plurality of solar cells 3 that are installed to a plurality of the meshes 23 of this woven mesh substrate 2C, and a plurality of first and second conductive junction blobs 4C, 5C for connecting these solar cells 3 to the horizontal strands 22. Since the solar cells 3 are the same as those of the first through the third embodiments, accordingly detailed description thereof will be omitted.

Next, the woven mesh substrate 2C will be explained.

As shown in FIGS. 17 through 20, the woven mesh substrate 2C comprises a plurality of mutually parallel vertical strands 21 that extend in the column direction (the vertical direction), a plurality of horizontal strands 22 that extend in the row direction (the horizontal direction in FIG. 1) and that are woven between the plurality of vertical strands 21 so as to be orthogonal to the plurality of vertical strands 21, and a meshes 23 in matrix form arranged in a plurality of rows and columns that are surrounded by the plurality of vertical strands 21 and this plurality of horizontal strands 22. This woven mesh substrate 2C is woven so that two of the horizontal strands, i.e. a first horizontal strand 22A and a second horizontal strand 22B, are disposed between the meshes 23 of each row and the meshes 23 of the adjacent row.

In a similar manner to the case with the first and second embodiments, a margin portion 24 is formed around the external peripheral portion of this woven mesh substrate 2C. This margin portion 24 is formed from first fabric portions 25 of predetermined width that are formed at both end portions in the length direction of the vertical strands 21 of the woven mesh substrate 2C, and second fabric portions 26 of predetermined width that are formed at both end portions in the length direction of the horizontal strands 22 of the woven mesh substrate 2C.

Figure 20:
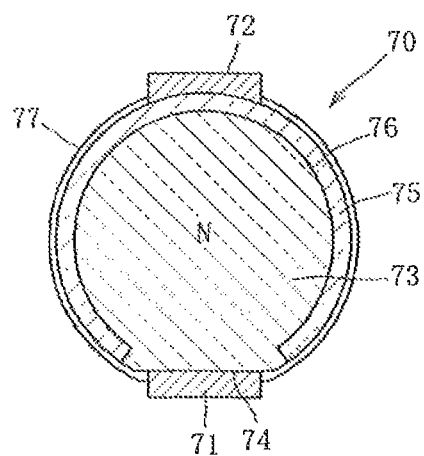
FIG. 20 is a sectional view of a spherical LED cell according to another variant embodiment.

Next, the first and second conductive junction blobs 4C, 5C will be explained. As shown in FIG. 20, each of the plurality of first conductive junction blobs 4C electrically connects the negative electrode 32 of one of the solar cells 3 to first and second horizontal strands 22A, 22B (i.e. a conductive connection member 20C), and each of the plurality of second conductive junction blobs 5C electrically connects the positive electrode 31 of one of the solar cells 3 to first and second horizontal strands 22A, 22B. Thus, these conductive junction blobs 4C, 5C are applied over both the first and the second horizontal strands 22A, 22B together.

The conductive junction blobs 4C, 5C are made from silver paste, and, when the solar cells 3 and the horizontal strands 22 (i.e. the first and second horizontal strands 22A, 22B) are connected together with this silver paste, for example, after having applied the silver paste to the site for joining the positive electrode 31 and the horizontal strand 22, and having applied it to the site for joining the negative electrode 32 and the horizontal strand 22, the silver paste is hardened by application of heat so that it is dried, and thereby it is possible to electrically connect together the positive electrode 31 of the solar cell 3 and its horizontal strand 22, and also its negative electrode 32 and its horizontal strand 22, and to adhere them together.

Figure 17:
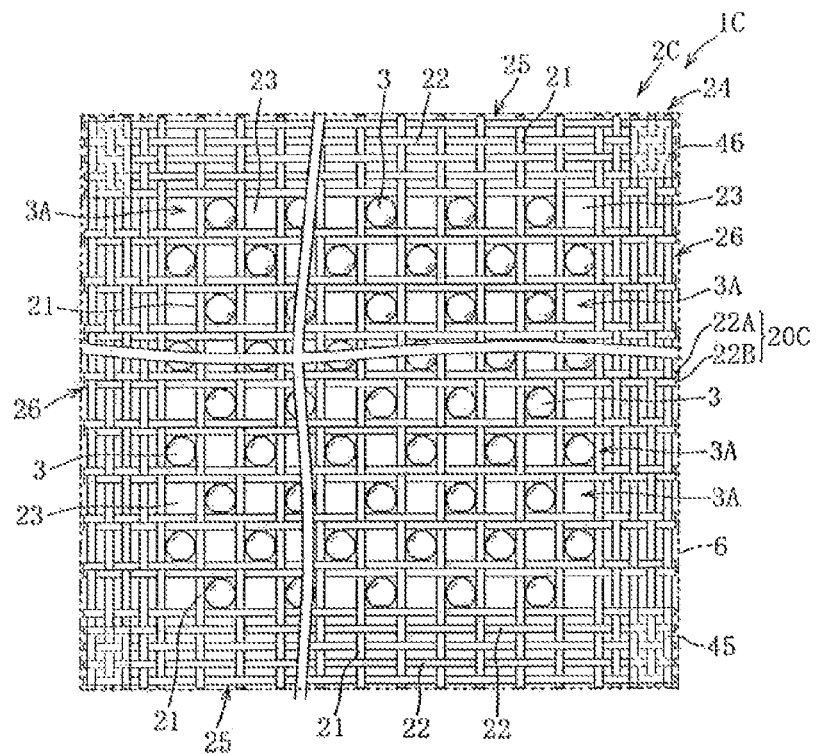
FIG. 17 is a plan view of a woven mesh substrate with semiconductor elements according to a fourth embodiment of the present invention.
Figure 18:
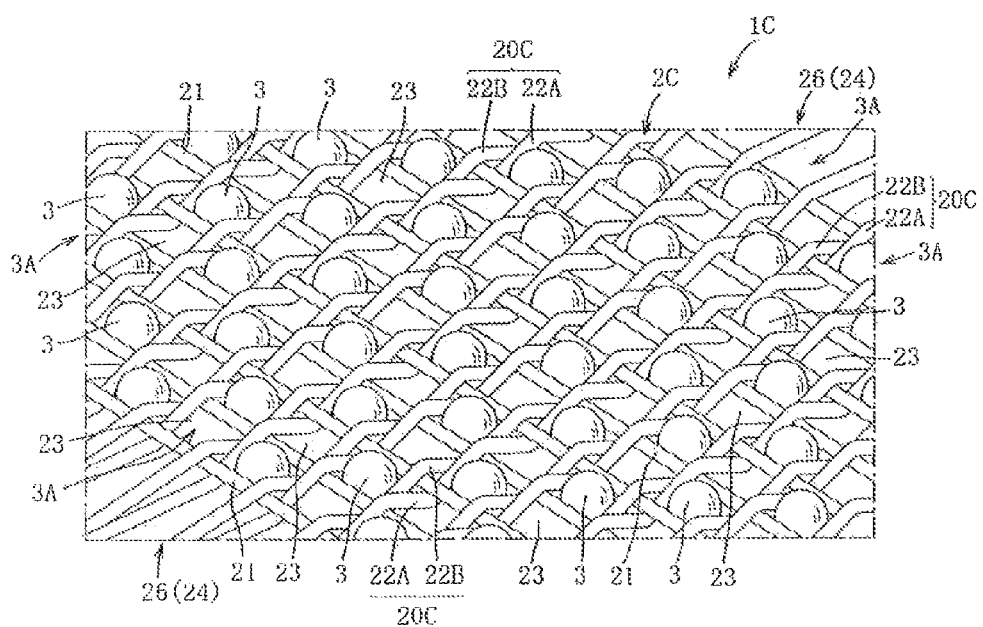
FIG. 18 is a perspective view of essential portions of the woven mesh substrate with semiconductor elements.
Figure 19:
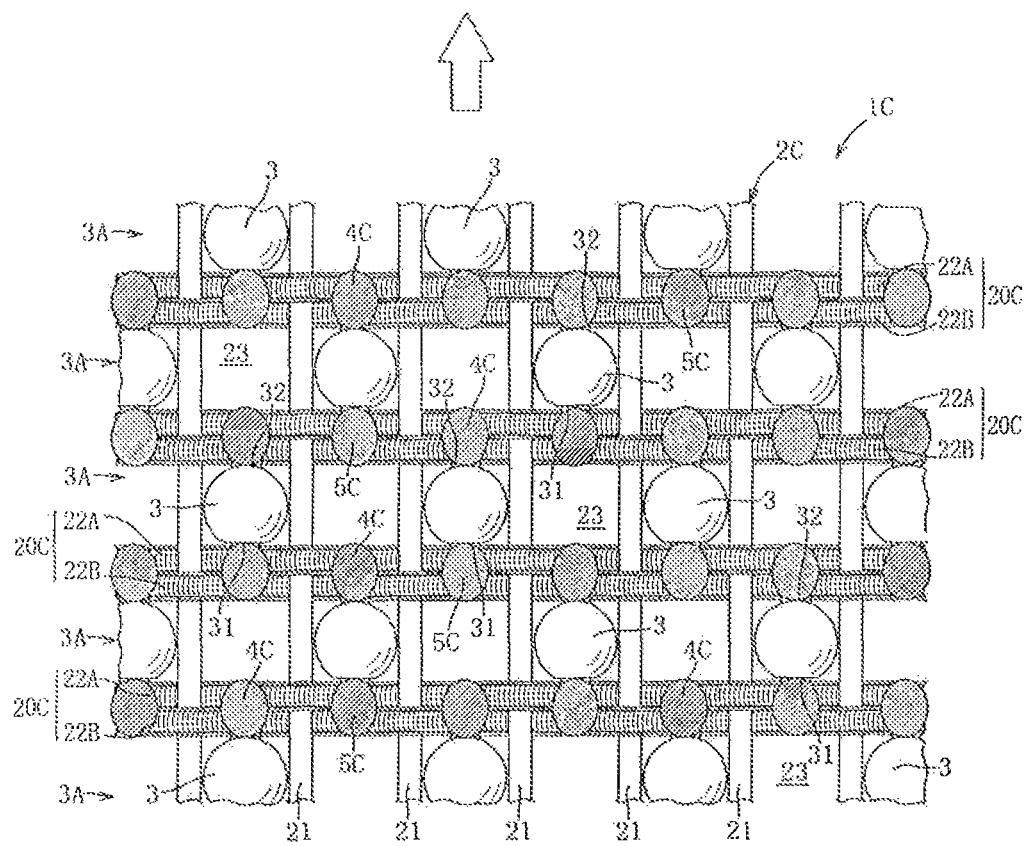
FIG. 19 is an enlarged plan view of essential portions of the woven mesh substrate with semiconductor elements.

Now, the series parallel connection construction of the plurality of solar cells 3 will be explained. As shown in FIGS. 17 through 19, the plurality of solar cells 3 are grouped into a plurality of groups in which row direction element groups 3A consisting of a plurality of the solar cells 3 arrayed along the horizontal direction (i.e. the row direction) may be taken as units, so that along with this plurality of row direction element groups 3A being arranged in a plurality of rows, conductive connection members 20C are disposed between adjacent row direction element groups 3A. The plurality of solar cells 3 in each of the row direction element groups 3A are electrically connected in parallel via its corresponding pairs of conductive connection members 20C, and the plurality of row direction element groups 3A are connected in series via the plurality of conductive connection members 20C.

As shown in FIG. 18, each of the conductive connection members 20C consists of a first and a second horizontal strand 22A, 22B that are adjacent in the vertical direction so that they can contact one another and be electrically connected together, that are woven in zigzag shapes so that each of them alternatingly contacts the front surfaces and the rear surfaces of the plurality of vertical strands 21, and that are woven so that the vertical strands 21 are held by the first horizontal strands 22A and the second horizontal strands 22B by being pinched between their front surfaces and their rear surfaces.

Since it is possible to connect the plurality of solar cells 3 of a row direction element group 3A and of an adjacent row direction element group 3A in series in this manner via the conductive connection members 20 that consist of the two first and second horizontal strands 22A, 22B, accordingly it is possible to arrange the plurality of row direction element groups 3A that are disposed in a plurality of rows in a state in which they are closely contacted together with no gaps being present between them. Due to this, it is possible to manufacture a woven mesh substrate with elements 1C to which a large quantity of the solar cells 3 are installed, and it is thus possible to enhance the light reception efficiency of the woven mesh substrate with elements 1C. It should be understood that, if the solar cells 3 are instead light emitting diodes, then it is possible to enhance the light emission performance.

Furthermore, since the weaving is done so that the vertical strands 21 are pinched by the first horizontal strands 22A and the second horizontal strands 22B between their front surfaces and their rear surfaces, accordingly it is possible to perform the weaving while keeping the vertical strands 21 lying in a dead straight state and not in a zigzag state, so that it is possible to enhance the tensile strength of the woven mesh substrate with elements 1C in the vertical direction (i.e. the column direction). Moreover, since the portions at which the first horizontal strands 22A and the second horizontal strands 22B cross one another are adhered to the positive electrodes 31 or the negative electrodes 32 of the solar cells 3 via the conductive junction blobs 4C, 5C, accordingly, as compared to the case in which they are only adhered to one horizontal strand 22, it is possible to suppress separation of the solar cells 3 from the first and second horizontal strands 22A, 22B, and also it is possible to enhance the tensile strength of the woven mesh substrate with elements 1C in the horizontal direction (i.e. the row direction). And, since the vertical strands 21 are pinched by the first and second horizontal strands 22A, 22B between their front surfaces and their rear surfaces, accordingly it is possible to reduce the elasticity in the horizontal direction, and thus the stability of the entire electrical combination can be ensured.

Since the conductive connection members 20C are formed from the two first and second horizontal strands 22A, 22B, accordingly the bending strength of the woven mesh substrate with elements 1C is enhanced, as compared with the case in which the conductive connection members 20C are made from a single horizontal strand. Furthermore, since the parallel connection of the plurality of solar cells 3 of the row direction element group 3A is maintained even if one of its two first and second horizontal strands 22A, 22B goes open circuit, accordingly the production quality of the woven mesh substrate with elements 1C is enhanced.

Next the manufacturing method for manufacturing the woven mesh substrate with elements 1C will be explained, but since the manufacturing method of this embodiment can be performed by utilizing any of the manufacturing devices 50, 50A, and 50B of the first through the third embodiments, accordingly in the following explanation it will be supposed that the woven mesh substrate with elements 1C is being manufactured by the manufacturing device 50B.

First, in a first step, after the plurality of vertical strands 21 have been passed over a supply side guide roller 51 and through a guide plate 52, they are separated by a heddle mechanism 53B into a first group of vertical strands 21a including a plurality of vertical strands 21 that are disposed mutually parallel with constant gaps between them, and a second group of vertical strands 21b including a plurality of vertical strands 21 that are disposed parallel to this first group of vertical strands 21a and are positioned alternatingly with respect thereto. And the first group of vertical strands 21a and the second group of vertical strands 21b are shifted to the left and right by the heddle mechanism 53B, so as to define a gap for passing a shuttle between the first and second groups of vertical strands 21a, 21b.

Next, in a second step, a shuttle member 54a of a shuttle mechanism 54B supplies a horizontal strand 22 (i.e. a first horizontal strand 22) along the direction orthogonal to the vertical strands 21 into the gap between the first and second groups of vertical strands 21a, 21b. Next, returning to the first step for a second time, the first group of vertical strands 21a and the second group of vertical strands 21b are shifted to the left and right by the heddle mechanism 53B, so that they are changed from their original left and right positional relationship to the opposite left and right positional relationship, and a gap is created for the shuttle to pass through between the first and second groups of vertical strands 21a, 21b; and then, in the second step for the second time, the shuttle member 54a of the shuttle mechanism 54B supplies a horizontal strand 22 (i.e. a second horizontal strand 22B) along the direction orthogonal to the vertical strands 21 into the gap between the first and second groups of vertical strands 21a, 21b.

After having repeated the first step and the second step twice successively in this manner, by executing a transition to a third step, it is possible to form the conductive connection member 20C that consists of the two first and second horizontal strands 22A, 22B. It is not necessary for the number of repetitions of the first step and the second step to be limited to two; it would be possible to vary this number of repetitions as appropriate, according to the number of horizontal strands 22 that are to make up the conductive connection member 20C. This step of repeating the first and second steps is one that corresponds to the step described in claim 2.

Next, in the third step, reed pushing is performed in which the two first and second horizontal strands 22A, 22B that have been supplied by the two repetitions of the second step are pushed to the downstream side by the reed mechanism 55B so that the two first and second horizontal strands 22A, 22B are regulated to the state of being orthogonal with respect to the vertical strands 21. At this time, if a plurality of the solar cells 3 were supplied to the downstream side in the processing one cycle previously, then the two first and second horizontal strands 22A, 22B are pushed against the positive electrodes 31 of the plurality of solar cells 3. In this manner, first, the woven mesh substrate 2C in net form is manufactured by being woven from the plurality of vertical strands 21 that are insulating and the plurality of horizontal strands that are electrically conductive.

Next, in a fourth step, conductive junction blobs 49 made from silver paste are applied by the application mechanism 56B to a plurality of sites on the two first and second horizontal strands 22A, 22B that have been reed pushed by the third step, corresponding to all of the meshes 23 of the net. It would also be possible to apply conductive junction blobs 49 selectively with the application mechanism 56B only to a plurality of sites that correspond to a portion of the meshes 23 of the net. Furthermore, the conductive junction blobs 49 for connecting the positive electrodes 31 of the solar cells 3 to the horizontal strands 22 are ones that correspond to the "second conductive junction blobs 5C", while the conductive junction blobs 49 for connecting the negative electrodes 32 of the solar cells 3 to the horizontal strands 22 are ones that correspond to the "first conductive junction blobs 4C".

If, in the fifth step of the previous cycle, in other words in the previous fifth step in which weaving was performed one pitch to the downstream side, a plurality of the solar cells of the row direction element group 3A adjacent on the downstream side were installed, then, along with conductive junction blobs 49 being applied by the application mechanism 49 to the plurality of sites on the first and second horizontal strands 22A, 22B that correspond to all of the meshes 23, they should also be applied to the positive electrodes 31 of the plurality of solar cells 3 that were installed in that previous fifth step.

Next, in a fifth step, a plurality of solar cells 3 corresponding to the portion of the plurality of sites on the first and second horizontal strands 22A, 22B at which the conductive junction blobs 49 were applied in the fourth step (in this embodiment, each alternate one of the meshes 23 in the left to right direction) are installed by a semiconductor element supply mechanism 59B, and their plurality of negative electrodes 32 are connected to both of the first and second horizontal strands 22A, 22B.

The solar cells 3 are installed to alternate ones of the meshes 23 in the upwards and downwards direction by repeatedly, in the fifth step, installing solar cells 3 to alternate ones of the meshes 23 in the left to right direction of the woven mesh substrate 2C, and, in the subsequent fifth step for performing the weaving of the next pitch, installing solar cells 3 to alternate ones of the meshes 23 in the left to right direction, displaced sideways by one pitch; but there is no requirement for the pattern of arrangement of the solar cells 3 to be particularly limited.

Next, in a sixth step, the plurality of nozzles 61cB of the heat application mechanism 61B are approached to the junction portions, and hot air is blown at all of the conductive junction blobs 49, so that heat is locally applied to the conductive junction blobs 49 and they are dried, and so that the conductive junction blobs 49 are hardened in a short period of time. By doing this, it is possible solidly to join the negative electrodes 32 of the plurality of solar cells 3 to the first and second horizontal strands 22A, 22B, and to connect them electrically thereto. At this time, if a plurality of the solar cells 3 in the row direction element group 3A one pitch towards the downstream side are installed, then it is possible to join the first and second horizontal strands 22A, 22B and the positive electrodes of the plurality of solar cells of that row direction element group 3A adjacent on the downstream side, and to connect them together electrically. It should be understood that this sixth step is one corresponding to the heat application step.

Next, in a seventh step, the woven mesh substrate with elements 1C is pulled out downwards by a pulling out mechanism (not shown) by one pitch, which corresponds to the diameter of the solar cells 3. While, finally, it will be acceptable for the downstream side portion of the woven mesh substrate with elements 1C to be stored by being wound up in cooperation with the above seventh step, i.e. while being intermittently pulled out by the amount of one pitch by the pulling out mechanism, the method for storing the woven mesh substrate with attached elements 1C need not be considered as being particularly limited. It should be understood that this seventh step is one corresponding to the heat application step.

It will be acceptable, in as similar manner to the case in the first embodiment, after the above described seventh step, to provide a covering step of covering both sides of the woven mesh substrate with elements 1C with protective insulating layers 6 that are flexible and optically transparent, for example surface layers of a silane coupling compound or the like (this would correspond to the covering step), or, in a similar manner to the case in the second embodiment, to provide a step of overlaying both sides of the woven mesh substrate with elements 1C with sheets 40 of a synthetic resin material that is flexible and optically transparent, and, by applying heat and pressure, to form a woven mesh substrate with semiconductor elements 1A (this would correspond to the overlaying step).

It is possible to manufacture the woven mesh substrate with elements 1C continuously by repeatedly executing the first step through the seventh step described above a plurality of times (the first and second steps should each be repeated twice in succession). This process of repetition is one that corresponds to the sixth step of claim 1.

Furthermore it would also be acceptable, in a similar manner to the case with the first and second embodiments above, to form first fabric portions 25 at both end portions of the woven mesh substrate with elements 1C in the length direction; it would also be acceptable to form second fabric portions 26 at both end portions of the woven mesh substrate with elements 1C in the width direction; and it would also be acceptable to form pairs of two such first fabric portions 25 successively at repeated positions spaced apart by an appropriate distance, at intermediate portions along the length direction of the woven mesh substrate with attached elements 1C. These intermediate portions at which these successive pairs of first fabric portions 25 are formed would become sites at which the woven mesh substrate could be divided into sections.

Since, while weaving the woven mesh substrate 2C from the plurality of vertical strands 21 and the plurality of horizontal strands 22 using a weaving machine (i.e. the manufacturing device 50B), the plurality of solar cells 3 are installed to this woven mesh substrate 2C, and their negative electrodes 32 and positive electrodes 31 are electrically connected with the conductive junction blobs 49 to the two first and second horizontal strands 22A, 22B, accordingly it is possible to automate the manufacture of the woven mesh substrate 2, the installation of the solar cells 3, and the application of the conductive junction blobs so that it is possible to manufacture a woven mesh substrate with elements 1C of stabilized product quality efficiently with a small number of processes.

According to this woven mesh substrate with elements 1C, since, in this woven mesh substrate with elements 1C, along with the plurality of solar cells 3 being grouped into a plurality of groups by taking as units the row direction element groups 3A that are made up from a plurality of solar cells 3 arranged along the horizontal direction, and with the plurality of row direction element groups 3A being arranged in a plurality of rows, also the conductive connection members 20C that are made up from the two first and second horizontal strands 22A, 22B are disposed between adjacent ones of the row direction element groups 3A, so that the plurality of solar cells 3 of each of the row direction element groups 3A are electrically connected in parallel via the pair of conductive connection members 20C, and the plurality of row direction element groups 3A are connected in series via the plurality of conductive connection members 20C, accordingly, in the case of a woven mesh substrate with elements 1C for light reception, it is possible to set the voltage that is generated freely via the number of elements that are connected in series, and furthermore it is possible to set the current that is generated freely via the number of elements that are connected in parallel. Explanations of the other structures, operation, and beneficial effects are omitted, since they are the same as in Embodiments #1 through #3.

Now, examples in which the above embodiments are partially altered will be explained.

[1] In the spherical solar cells 3 of Embodiments #1 through #4, it would also be acceptable to make the pn junctions by forming p type diffused layers on spherical n type silicon crystals.

[2] In the first through the fourth embodiments, it would also be acceptable to manufacture a woven mesh substrate for light emission incorporating, as attached elements, instead of the solar cells 3 described above, a plurality of spherical LED cells 70 having a light emission function and each having a positive electrode 71 and a negative electrode 72. For example, the spherical LED cell 70 shown in FIG. 20 includes an n type spherical semiconductor 73, a flat surface 74, a spherical p type diffused layer 75, a pn junction 70, a phosphor surface coating 77 that is formed over its entire surface, and so on; and the LED cells 70 emit light when voltage is applied between the conducting lines of the woven mesh substrate with elements and current flows through the LED cells 70 in the forward direction (normal direction). Since the light emission color of the phosphor surface coating 77 is determined according to the components of the phosphor, accordingly it is also possible to employ LED cells 70 of various light emission colors.

[3] And, while in the first through the fourth embodiments silver paste is used for the conductive junction blobs 4, 5, 4C, 5C, and 49, this is not to be considered as being limitative; it would also be acceptable to arrange for the positive electrodes 31 and the negative electrodes 32 of the solar cells 3 to be connected to the horizontal strands 22 with solder paste (i.e. tin or silver solder paste or the like). In this case, after having applied the solder paste to the horizontal strands 22, heat is applied at a high temperature by the heat application mechanism 61 so that the solder paste is melted, and thereby the positive electrodes 31 and the negative electrodes 32 of the solar cells 3 are electrically connected to the horizontal strands 22.

[4] In the first through the fourth embodiments, instead of the heat application mechanisms 61, 61B for hardening the conductive junction blobs 4, 5, 4C, 5C, and 49, it would also be acceptable to apply heat to the conductive junction blobs 4, 5, 4C, 5C, and 49 and to harden them by flowing a high pulse current through the horizontal strands 22, thus taking advantage of the Joule heat generated in the horizontal strands 22. Moreover, it would also be acceptable to arrange to apply heat to the conductive junction blobs 4, 5, 4C, 5C, and 49 and to harden them by combining a mechanism that flows a high pulse current through the horizontal strands 22 with a heat application mechanism 61, 61B.

[5] In the first through the fourth embodiments, for the vertical strands 21, it would also be possible to employ twisted lines made from a plurality of insulating synthetic resin fibers, or to employ single rods or ribbon members that are not twisted. Furthermore, for the horizontal strands 22, it would also be possible to employ twisted lines made from a plurality of thin metallic wires, or to employ single rods or ribbon members that are not twisted.

[6] While the horizontal strands 22 of the first through the fourth embodiments have a structure in which thin metallic wires are covered over glass fibers in the form of two coils, this is not to be considered as being particularly limitative; instead of such thin metallic wires, it would also be acceptable to provide a construction in which an electrically conductive surface coating is formed on the surfaces of twisted lines that are made from a plurality of glass fibers. Furthermore, it would also be acceptable to form the horizontal strands 22 as conducting lines made from bundles of carbon fiber which are electrically conductive, or as conducting lines in which thin metallic wires are covered over the surfaces of bundles of such carbon fibers in the form of coils.

[7] While the conductive connection members 20 of the first through the fourth embodiments were made from one or two of the horizontal strands 22, this is not necessarily limitative; it would also be acceptable to arrange to form the conductive connection members from three or more horizontal strands.

[8] While the first and second application mechanisms 57, 58 of the first and the second embodiments were provided by the common application mechanism 56, it would also be acceptable for the first and second application mechanisms 57, 58 to be built as separate units.

[9] The protective layer covering mechanism 62 for forming layers of transparent resin on the upper and lower surfaces of the woven mesh substrate with attached elements 1 of the first embodiment, and the heat application and pressurization mechanism 65 for sandwiching both the upper and lower surfaces of the woven mesh substrate with attached elements 1A of the second embodiment with sheets 40 of a synthetic resin material and then applying heat and pressure thereto, are not absolutely necessary; it would also be acceptable to omit either or both of them, depending on the specification. Moreover, it would also be acceptable to manufacture the woven mesh substrate with elements 1A by, after having formed protective insulating layers 6 on both the upper and lower surfaces of the woven mesh substrate with elements 1 with a protective layer covering mechanism 62, sealing the woven mesh substrate with elements 1 within sheets 40 of a synthetic resin material that is flexible and optically transparent in an embedded manner with a heat application and pressurization mechanism 65, and forming layers 42 from a synthetic resin film that is flexible and optically transparent on both the upper and lower surfaces of the synthetic resin material sheets 40.

[10] While, in the first through the fourth embodiments, the negative electrodes 32 of the solar cells 3 were taken as being their first electrodes and their positive electrodes were taken as being their second electrodes, this is not to be considered as necessarily being limitative; conversely, it would also be acceptable to take their negative electrodes 32 as being their second electrodes and their positive electrodes 31 as being their first electrodes. In this case, the air pincettes 59b, 59bB of the semiconductor element supply mechanisms 59, 59B would pick up and hold the solar cells 3 by the sides of their negative electrodes 32, and, after the air pincettes 59b, 59bB have been rotationally driven, the positive electrodes 31 of the solar cells 3 would be joined to the horizontal strand 22 to which the first conductive junction blobs 4, 4C or the conductive junction blobs 49 have been applied.

[11] It would also be acceptable to form protective insulating layers 6 made from parylene on both the sides of the woven mesh substrates 2, 2C and the plurality of solar cells 3 of the first through the fourth embodiments. In this case, it is possible to form a surface coating uniformly over the entire surface of the woven mesh substrate with elements 1, since parylene permeates into narrow gaps even at the molecular level. The refractive index of parylene is around 1.64, and, by covering the surfaces of the solar cells 3, the beneficial effect of preventing reflection as compared to when light is incident from air, and the beneficial effect of enhancing the electrical insulation are obtained. It is also possible to anticipate the beneficial effects of prevention of transmission of water vapor or gas and of excellent chemical resistance and radiation resistance and so on, and furthermore it is possible to anticipate the beneficial effect of prevention of deterioration of the solar cells 3, of the plurality of vertical strands 21, of the plurality of horizontal strands 22, and of the conductive junction blobs 4, 5, 4C, 5C, 49. However not only may the protective insulating layers 6 be made as surface coatings of a silane coupling compound or of parylene, but it would also be acceptable to make them from a synthetic resin material that is optically transparent and flexible (for example, as coatings of silicon resin).

Figure 21:
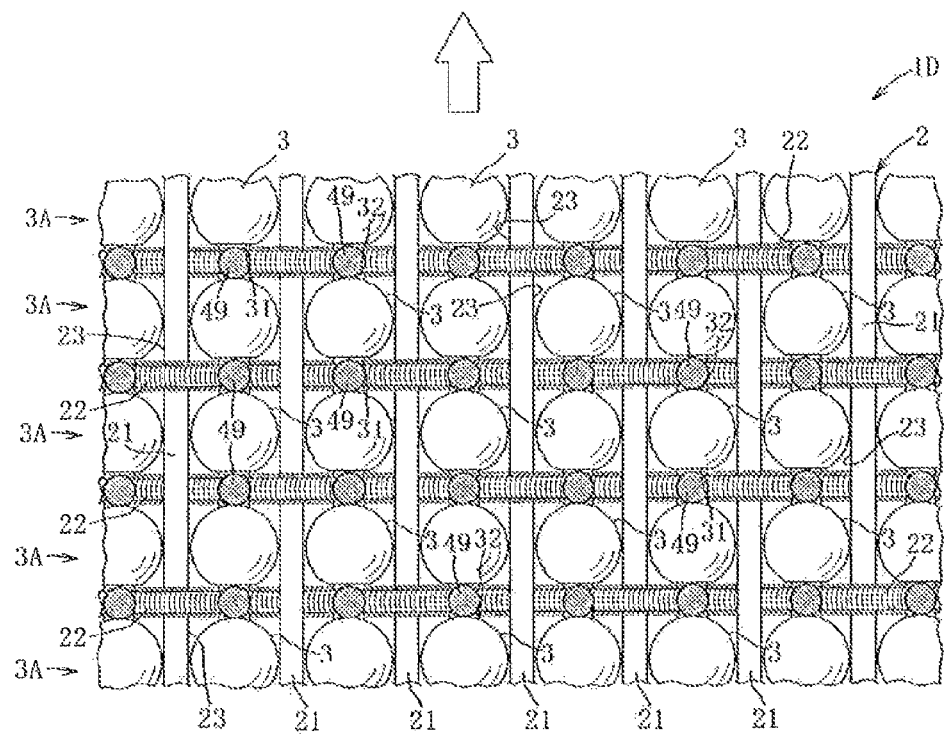
FIG. 21 is an enlarged plan view of essential portions of a woven mesh substrate with semiconductor elements according to another variant embodiment.
Figure 22:
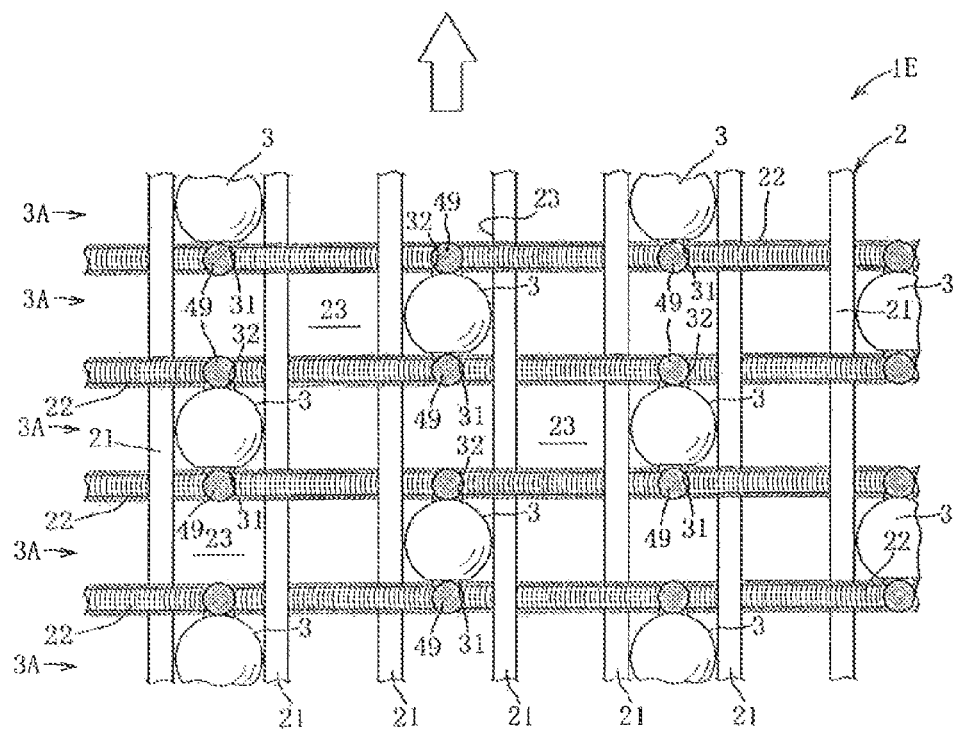
FIG. 22 is an enlarged plan view of principal portions of a woven mesh substrate with semiconductor elements according to another variant embodiment.

[12] In the first through the fourth embodiments, as shown in FIG. 21, it would also be acceptable to weave a woven mesh substrate with elements 1D in which solar cells 3 are installed to all of the meshes 23, by applying conductive junction blobs 49 at a plurality of sites that correspond to all of the meshes 23 in the net, and by installing a plurality of solar cells 3 that correspond to all of the plurality of sites at which the conductive junction blobs 49 have been applied. Moreover, as shown in FIG. 22, it would also be acceptable to weave a woven mesh substrate with elements 1E in which solar cells 3 are installed to, for example, each fourth one of the meshes 23 in the row direction and to alternate ones of the meshes 23 in the column direction, by applying conductive junction blobs 49 at a plurality of sites that correspond to a portion of the meshes 23 in the net, and by installing a plurality of solar cells 3 that correspond to all of the plurality of sites at which the conductive junction blobs 49 have been applied. Furthermore, these patterns for arrangement of the solar cells 3 are not necessarily to be considered as being limitative; it would be acceptable to weave a woven mesh substrate with attached elements by employing various other patterns of arrangement.

Figure 23:
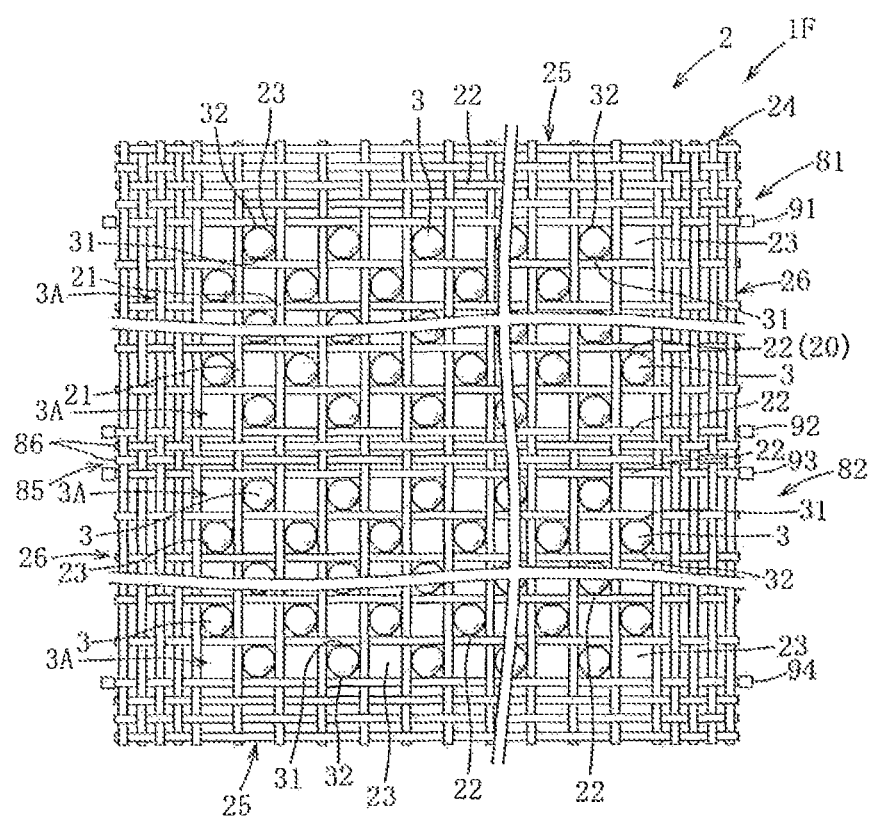
FIG. 23 is a plan view of a woven mesh substrate with semiconductor elements according to another variant embodiment.
Figure 24:
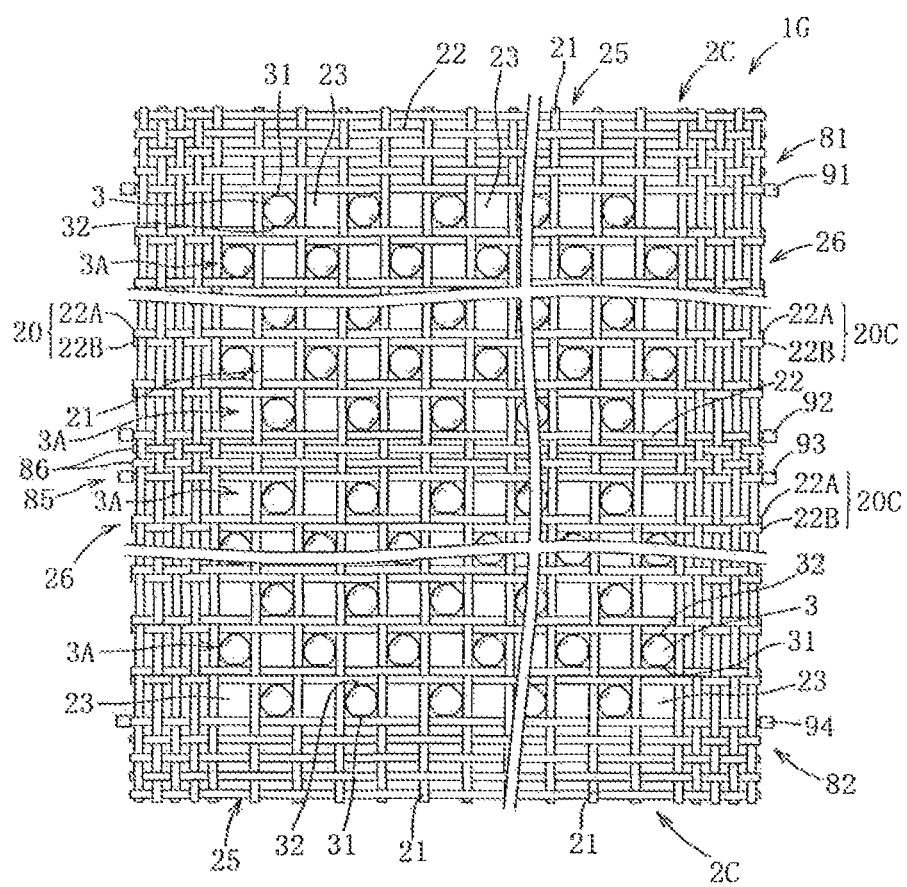
FIG. 24 is a plan view of a woven mesh substrate with semiconductor elements according to another variant embodiment.

[13] As shown in FIGS. 23 and 24, it would also be acceptable to form at least one insulating separation hand 85 of predetermined width at an intermediate portion in the vertical direction of the woven mesh substrate 2 of the woven mesh substrate with elements 1F, 1G, in which no solar cells 3 are installed in the plurality of meshes 23 along the horizontal direction, but in which, rather, a plurality of insulating lines 86 (for example, two insulating lines 86) are provided as being disposed more tightly than the meshes 23. Thus, the woven mesh substrate with elements 1F, 1G would be divided into sections, i.e. into a first region 81 on an upper side portion and a second region 82 on a lower side portion, by this insulating separation body 85 which serves as a boundary. The plurality of solar cells 3 in the first region 81 and the plurality of solar cells 3 in the second region 82 are installed to the plurality of meshes 23 of the woven mesh substrate 2 so that their conductive directions, which are specified by their positive electrodes 31 and their negative electrodes 32, are orientated oppositely. It should be understood that it would also be acceptable to provide a plurality of insulating separation hands 85 at several positions part way along the length direction of the woven mesh substrate with attached elements 1F, 1G, so as to divide it into a number of sections each of which is of appropriate length. Moreover, it is not necessary for the insulating separation band 85 to be made from two insulating lines 86; it would also be acceptable for it to be made from only one insulating line 86, or from a plurality thereof that is three or more. Yet further, the vertical width of the insulating separation band 85 may be set as appropriate, according to the specification.

In concrete terms, in FIG. 23, the solar cells 3 in the first region 81 are installed in the orientation with their negative electrodes 32 facing upwards and their positive electrodes facing downwards, while the solar cells 3 in the second region 82 are installed so that their conductive directions are oriented oppositely to those of the solar cells in the first region 81, i.e. with their positive electrodes facing upwards and their negative electrodes 32 facing downwards. It should be understood that the plurality of solar cells 3 of FIG. 24 are arranged in configurations in the first and second regions 81, 82 such that their conductive directions are in orientations opposite to those of FIG. 23. And external terminals 91, 92 are formed at the two end portions of the horizontal strands 22 that are at the extreme top edge and at the extreme bottom edge respectively of the first region 81. Moreover, external terminals 93, 94 are formed at the two end portions of the horizontal strands 22 that are at the extreme top edge and at the extreme bottom edge respectively of the second region 82.

In weaving this insulating separation band 85 into the woven mesh substrate with attached elements 1F, 1G, in the second step, a horizontal strand 54 that consists of a conducting line is supplied by the shuttle mechanism 54 into the gap between the first and second groups of vertical strands 21a, 21b, and, after this has been pushed by the reed mechanism 55 in the third step and before transition to the fourth step, the flow returns hack to the first step again, the first group of vertical strands 21a and the second group of vertical strands 21b are shifted by the heddle mechanism 53 so that their up and down positional relationship changes from the original up and down positional relationship to the opposite up and down positional relationship, and then an insulating line 86 is supplied into the gap between the first and second groups of vertical strands 21a, 21b by a shuttle member 54a to which the insulating line 86 has been connected. After this has been repeated a plurality of times, and after the insulating separation band 85 has been woven from the plurality of insulating lines 86 and the vertical strands 21 (which are insulating lines), finally a horizontal strand 22 that consists of a conducting line is supplied and pushed by the reed, and then the flow transitions to the fourth step. It should be understood that it would also be acceptable to arrange for the reed pushing in the third step to be performed only once, after the manufacture of the insulating separation band 85 by weaving has been completed.

By dividing the woven mesh substrate with elements 1F, 1G into the first and second regions 81 and 82 by the insulating separation band 85 in this manner, and by providing the external terminals 91 through 94 to the regions 81, 82, it is possible to connect the first and second regions 81, 82 either in series or in parallel, via the external terminals 91 through 94 that are on the outside edges of the woven mesh substrate with elements 1F, 1G. Due to this, if a plurality of the insulating separation bands 85 are provided to the woven mesh substrate with elements 1F, 1G, then, by dividing the woven mesh substrate with attached elements 1F, 1G into a plurality of regions and by providing external terminals to these regions, it is possible to set the voltage that is generated freely via the number of series connections, and it is also possible to set the current that is generated freely via the number of parallel connections.

Furthermore, while the conductive directions of the solar cells 3 in the first and second regions 81, 82 are provided in opposite orientations, they are not necessarily particularly limited to being in opposite orientations; it would also be acceptable to set the conductive directions in the first and second regions 81, 82 to be the same orientation; and it would also be acceptable to replace the solar cells 3 in one of the first and second regions 81, 82 with solar cells that are made with pn junctions by forming p type diffused layers in spherical n type silicon crystals. In other words, by dividing up the long woven mesh substrate with elements which is the shape of a belt into a plurality of unit regions with a plurality of insulating separation bands 85, it is possible to set the shapes and the conductive directions of the solar cells as appropriate in each unit region. Moreover, in order to set the output voltage as required according to the design specification, it is possible to provide the insulating separation bands 85 to the woven mesh substrate with elements in an appropriate manner, so that it is possible to adjust the output voltage of each region.

[14] With the manufacturing devices 50, 50A, and 50B of the first through the third embodiments, it would also be acceptable to provide a structure that is capable of independently rotationally driving each of the plurality of dispensettes 56b, 56bB of the application mechanisms 56, 56B and each of the plurality of air pincers 59b, 59bB of the semiconductor element supply mechanisms 59, so as to correspond to the meshes 23 to which the solar cells 3 are to be installed, according to the desired pattern for arrangement of the solar cells 3. Moreover, it would also be acceptable to provide a structure in which the first rotation drum 56a, 56aB and the second rotation drum 59a, 59aB are shiftable along their axial directions, according to the desired pattern for arrangement of the solar cells 3.

[15] Apart from the above, various changes and additions to the above embodiments could be implemented by a person skilled in the art without deviating from the spirit of the present invention; and the present invention also includes variant embodiments of these types.

The woven mesh substrate with semiconductor elements according to the present invention is flexible, translucent to daylight (or see through) and thin, and is capable of being applied to a solar battery panel or to a light emission panel that is light in weight, and can be installed not only as a fabric material but also as a window glass or on the wall surface of a building, so that it is possible to implement a solar battery panel which has excellent freedom of design.

DESCRIPTION OF NUMERALS 1, 1A, 1C through 1G: woven mesh substrates with semiconductor element
2, 2C: woven mesh substrate
3: spherical solar cell (spherical semiconductor element provided with light-receiving function)
3A: row direction element group
4, 4C: first conductive junction blob
5, 5C: second conductive junction blob
6: protective insulating layer
20, 20C: conductive connection member
21: vertical strand
21a: first group of vertical strands
21b: second group of vertical strands
22: horizontal strands
22A: first horizontal strand
22B: second horizontal strand
23: mesh
24: margin portion.
25: first fabric portion
26: second fabric portion
31: positive electrode (second electrode)
32: negative electrode (first electrode)
40: synthetic resin material sheet
41: EVA sheet
42: synthetic resin film layer
49: conductive junction blob
50, 50A, 50B: devices for manufacturing a woven mesh substrate with attached semiconductor elements
51: supply side guidance roller
53: heddle mechanism
54: shuttle mechanism
55: reed mechanism
56, 56B: application mechanism
56a, 56aB: first rotation drum
56b, 56bB: dispenser
57: first application mechanism
58: second application mechanism
59, 59B: semiconductor element supply mechanism
59a, 59aB: second rotation drum
59b, 59bB: air pincettes
61, 61B: heat application mechanism
62: protective layer covering mechanism
63: pulling out mechanism
65: heat application and pressurization mechanism
70: spherical LED cell (spherical semiconductor element provided with light emission function)
85: insulating separation band
86: insulating line

The invention claimed is:

1. A method for manufacturing a woven mesh substrate with semiconductor elements, in which a plurality of spherical semiconductor elements having a light-receiving function or a light-emitting function, and each having a first and a second electrode, are installed to a woven mesh substrate in net form that is woven from a plurality of vertical strands that are insulating and a plurality of horizontal strands that are electrically conductive, comprising:

a first step of shifting, with a heddle mechanism, a first group of vertical strands including a plurality, of vertical strands arranged mutually parallel with fixed gaps between them, and a second group of vertical strands including a plurality of vertical strands positioned parallel to the first group of vertical strands and alternatingly therewith, and creating a gap between the first and second groups of vertical strands;

a second step of supplying, with a shuttle mechanism, a horizontal strand through the gap between said first and second groups of vertical strands;

a third step of pushing, with a reed mechanism, the horizontal strand that has been supplied by said second step;

a fourth step of applying conductive junction blobs at a plurality of sites corresponding to all or a part of the net meshes on the horizontal strand that has been reed pushed by said third step;

a fifth step of installing a plurality of spherical semiconductor elements corresponding to all or a portion of the plurality of sites at which said conductive junction blobs have been applied by said fourth step, thus connecting a plurality of their first electrodes or of their second electrodes to the horizontal strand; and a sixth step of repeating said first process through said fifth step a plurality of times.

2. A method for manufacturing a woven mesh substrate with semiconductor elements according to claim 1, wherein the transition to said third step occurs after having repeated said first step and said second step at least twice in succession.

3. A method for manufacturing a woven mesh substrate with semiconductor elements according to claim 1, wherein, after said fifth step and before said sixth step, there is provided a heat application step of applying heat to said conductive junction blobs.

4. A method for manufacturing a woven mesh substrate with attached semiconductor elements according to claim 1, wherein, after said fifth step and before said sixth step, there is provided a pulling out step of pulling out said woven mesh substrate with semiconductor elements by a predetermined length.

5. A method for manufacturing a woven mesh substrate with semiconductor elements according to claim 1, wherein, after said fifth step and before said sixth step, there is provided a covering step of covering both sides of said woven mesh substrate with semiconductor elements with protective insulating layers that are flexible and optically transparent.

6. A method for manufacturing a woven mesh substrate with semiconductor elements according to claim 1, wherein, after said fifth step and before said sixth step, there is provided an overlaying step of overlaying both sides of said woven mesh substrate with semiconductor elements with sheets of a synthetic resin material that are flexible and optically transparent, and then applying heat and pressure thereto.

7. A method for manufacturing a woven mesh substrate with semiconductor elements according to claim 1, wherein:

in said fourth step, first conductive, unction blobs are applied at a plurality of sites on said horizontal strand at which said plurality of spherical semiconductor elements are to be connected;

in said fifth step, a plurality of spherical semiconductor elements are installed corresponding to the plurality of sites at which said first conductive junction blobs have been applied, with the plurality of first electrodes thereof being connected to said plurality of sites; and after said fifth step and before said sixth step, there is provided an application process of applying second conductive junction blobs to the plurality of second electrodes of said plurality of spherical semiconductor elements.

8. A method for manufacturing a woven mesh substrate with semiconductor elements according to claim 1, wherein, in said fourth step, a plurality of conductive junction blobs are applied from an upper side of said horizontal strand; and, in said fifth step, a plurality of spherical semiconductor elements are installed from the upper sides of the plurality of conductive junction blobs that were applied in said fourth step.

9. A woven mesh substrate with semiconductor elements, to which a plurality of spherical semiconductor elements having a light-receiving function or a light-emitting function are installed, comprising:

a woven mesh substrate in net form, woven from a plurality of vertical strands that are insulating and a plurality of horizontal strands that are electrically conductive, and having meshes arranged in a plurality of rows and a plurality of columns; and a plurality of spherical semiconductor elements each of which has a light-receiving function or a light-emitting function and a first and a second electrode, and installed to a plurality of the meshes of said woven mesh substrate in a state in which their conductive directions as specified by said first and second electrodes are lined up in the vertical direction parallel to the vertical strands;

and in that:

said plurality of spherical semiconductor elements are grouped into a plurality of groups, taking row direction element groups comprising a plurality of spherical semiconductor elements lined up along the horizontal direction as units;

said plurality of row direction element groups are arranged in said plurality of rows, with conductive connection members comprising one or a plurality of horizontal strands being disposed between adjacent row direction element groups;

the plurality of spherical semiconductor elements of each row direction element group are electrically connected in parallel via a pair of said conductive connection members; and said plurality of row direction element groups are connected in series via a plurality of said conductive connection members.

10. A woven mesh substrate with semiconductor elements according to claim 9, wherein:

each of said conductive connection members comprises a first and a second horizontal strand that are adjacent in the vertical direction so as to contact one another and are electrically connected together, each of which is woven in a zigzag state so as to contact the front surfaces and the rear surfaces of said plurality of vertical strands alternatingly; and the weaving pattern sandwiches the vertical strands by said first horizontal strands and said second horizontal strands from their front surfaces and their rear surfaces.

11. A woven mesh substrate with semiconductor elements according to claim 9, wherein:

first fabric portions of predetermined width in fabric form are formed at both end portions of said woven mesh substrate in the lengthwise direction of said vertical strands by a plurality of horizontal strands that are arranged more tightly than in said meshes, and by said plurality of vertical strands; and second fabric portions of predetermined width in fabric form are formed at both side portions of said woven mesh substrate in the lengthwise direction of said horizontal strands by a plurality of vertical strands that are arranged more tightly than in said meshes, and by said plurality of horizontal strands.

12. A woven mesh substrate with semiconductor elements according to claim 9 both sides of said woven mesh substrate and the plurality of spherical semiconductor elements are covered over by protective insulating layers that are flexible and optically transparent.

13. A woven mesh substrate with semiconductor elements according to claim 9, wherein said woven mesh substrate and said plurality of spherical semiconductor elements are sealed in an embedded manner within sheets of synthetic resin material that are flexible and optically transparent, and synthetic resin film layers that are flexible and optically transparent are formed on both sides of said synthetic resin material sheets.

14. A woven mesh substrate with semiconductor elements according to claim 9, wherein said vertical strands are made as bundles of glass fibers or synthetic resin fibers, and said horizontal strands are made as conducting lines in which thin metallic wires are covered in the form of coils over the surfaces of bundles of glass fibers or synthetic resin fibers.

15. A woven mesh substrate with semiconductor elements according to claim 9, wherein said horizontal strands are made as conducting lines consisting of bundles of electrically conductive carbon fibers, or as conducting lines in which thin metallic wires are covered in the form of coils over the surfaces of bundles of said carbon fibers.

16. A woven mesh substrate with semiconductor elements according to claim 9, wherein at least one insulating separation band of predetermined width, in which a plurality of insulating lines are arranged in the horizontal direction more tightly than in said meshes, is formed at an intermediate portion of said woven mesh substrate in the vertical direction.

17. A device for manufacturing a woven mesh substrate with semiconductor elements in which a plurality of spherical semiconductor elements having a light-receiving function or a light-emitting function, and each having a first and a second electrode, are installed to a woven mesh substrate in net form that is woven from a plurality of vertical strands that are insulating and a plurality of horizontal strands that are electrically conductive, comprising:
  a supply side guide roller that guides a plurality of vertical strands supplied from a vertical strand supply source;
  a heddle mechanism that shifts a first group of vertical strands including a plurality of vertical strands arranged mutually parallel with fixed gaps between them, and a second group of vertical strands including a plurality of vertical strands positioned parallel to the first group of vertical strands and alternatingly therewith, and creates a gap between the first and second groups of vertical strands;
  a shuttle mechanism that supplies a horizontal strand through the gap created by said peddle mechanism between said first and second groups of vertical strands;
  a reed mechanism that pushes the horizontal strand that has been supplied by said shuttle mechanism;
  an application mechanism that applies conductive junction blobs at a plurality of sites on said horizontal strand corresponding to all or a part of the net meshes; and
  a semiconductor element supply mechanism that installs a plurality of spherical semiconductor elements to correspond to all or a portion of the plurality of sites at which said conductive junction blobs have been applied, and that thus connects the plurality of first electrodes or of second electrodes to the horizontal strand.

18. A device for manufacturing a woven mesh substrate with semiconductor elements according to claim 17, wherein said application mechanism comprises a first rotation drum and a plurality of L shaped dispensers that are fixed to the outer circumferential surface of the first rotation drum at fixed intervals along its axial direction, and that are adapted to pick up and distribute conductive junction blobs at their end portions.

19. A device for manufacturing a woven mesh substrate with semiconductor elements according to claim 17, wherein said semiconductor element supply mechanism comprises a second rotation drum to the interior of which negative pressure can be supplied, and a plurality of air pincettes that are made as L shaped pipe members, and that are fixed to the outer circumferential surface of this second rotation drum at fixed intervals along its axial direction.

20. A device for manufacturing a woven mesh substrate with semiconductor elements according to claim 17, comprising a heat application mechanism that applies heat to and dries said conductive junction blobs.

21. A device for manufacturing a woven mesh substrate with semiconductor elements according to claim 17, comprising a pulling out mechanism that pulls out said woven mesh substrate with semiconductor elements by successive predetermined lengths.

22. A device for manufacturing a woven mesh substrate with semiconductor elements according to claim 17, comprising a protective layer covering mechanism that covers both sides of said woven mesh substrate with semiconductor elements with flexible and optically transparent protective insulating layers.

23. A device for manufacturing a woven mesh substrate with semiconductor elements according to claim 17, comprising a heat application and pressurization mechanism that applies heat and pressure to both sides of said woven mesh substrate with semiconductor elements, in the state in which they are overlaid with flexible and optically transparent sheets of synthetic resin material.

\* \* \* \* \*